United States Patent
Suzuki et al.

(10) Patent No.: US 10,410,857 B2
(45) Date of Patent: Sep. 10, 2019

(54) FORMATION OF SIN THIN FILMS

(71) Applicant: ASM IP Holding B.V., Almere (NL)

(72) Inventors: Toshiya Suzuki, Helsinki (FI); Viljami J. Pore, Helsinki (FI); Shang Chen, Tokyo (JP); Ryoko Yamada, Kanagawa (JP); Dai Ishikawa, Tokyo (JP); Kunitoshi Namba, Tokyo (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/834,290

(22) Filed: Aug. 24, 2015

(65) Prior Publication Data

US 2017/0062204 A1    Mar. 2, 2017

(51) Int. Cl.
*H01L 21/02* (2006.01)

(52) U.S. Cl.
CPC ...... *H01L 21/0228* (2013.01); *H01L 21/0217* (2013.01); *H01L 21/02208* (2013.01); *H01L 21/02274* (2013.01)

(58) Field of Classification Search
CPC ............ C23C 16/45536; C23C 16/345; C23C 16/45542; C23C 16/52; H01L 21/0228; H01L 21/02211; H01L 21/02329; H01L 21/0234
See application file for complete search history.

(56) References Cited

U.S. PATENT DOCUMENTS

| 4,668,365 | A  | 5/1987  | Foster et al. |
| 4,683,147 | A  | 7/1987  | Eguchi et al. |
| 4,696,834 | A  | 9/1987  | Varaprath |
| 6,391,803 | B1 | 5/2002  | Kim et al. |
| 6,475,276 | B1 | 11/2002 | Elers et al. |
| 6,586,056 | B2 | 7/2003  | Arkles et al. |
| 6,730,614 | B1 | 5/2004  | Lim et al. |

(Continued)

FOREIGN PATENT DOCUMENTS

| JP | 01-103844 | 4/1989 |
| JP | 05-070957 | 3/2003 |

(Continued)

OTHER PUBLICATIONS

Keinan et al., "Diiodosilane. 1. A Novel Reagent for Deoxygenation of Alcohols and Ethers," J.Org.Chem., 1987, vol. 52, pp. 4846-4851.

(Continued)

*Primary Examiner* — Frederick B Hargrove
(74) *Attorney, Agent, or Firm* — Knobbe, Martens, Olson & Bear LLP

(57) ABSTRACT

Methods of forming silicon nitride thin films on a substrate in a reaction space under high pressure are provided. The methods can include a plurality of plasma enhanced atomic layer deposition (PEALD) cycles, where at least one PEALD deposition cycle comprises contacting the substrate with a nitrogen plasma at a process pressure of 20 Torr to 500 Torr within the reaction space. In some embodiments the silicon precursor is a silyl halide, such as $H_2SiI_2$. In some embodiments the processes allow for the deposition of silicon nitride films having improved properties on three dimensional structures. For example, such silicon nitride films can have a ratio of wet etch rates on the top surfaces to the sidewall of about 1:1 in dilute HF.

10 Claims, 9 Drawing Sheets

(56) References Cited

U.S. PATENT DOCUMENTS

| | | | |
|---|---|---|---|
| 6,756,318 B2 | 6/2004 | Nguyen et al. |
| 6,933,245 B2 | 8/2005 | Lee et al. |
| 7,473,655 B2 | 1/2009 | Wang et al. |
| 7,625,609 B2 | 12/2009 | Matsuura |
| 7,651,955 B2 | 1/2010 | Ranish et al. |
| 7,713,592 B2 | 5/2010 | Nguyen et al. |
| 7,713,874 B2 | 5/2010 | Milligan |
| 8,080,290 B2 | 12/2011 | Hasebe et al. |
| 8,114,761 B2 | 2/2012 | Mandrekar et al. |
| 8,119,544 B2 | 2/2012 | Hasebe et al. |
| 8,236,097 B2 | 8/2012 | Wang et al. |
| 8,242,031 B2 | 8/2012 | Mallick et al. |
| 8,298,628 B2 | 10/2012 | Yang et al. |
| 8,329,599 B2 | 12/2012 | Fukazawa et al. |
| 8,563,096 B2 | 10/2013 | Matsunaga et al. |
| 8,580,664 B2 | 11/2013 | Clark |
| 8,592,328 B2 | 11/2013 | Hausmann et al. |
| 8,722,546 B2 | 5/2014 | Fukazawa et al. |
| 9,455,138 B1 | 9/2016 | Fukazawa et al. |
| 9,564,309 B2 | 2/2017 | Niskanen et al. |
| 9,576,792 B2 | 2/2017 | Chen et al. |
| 9,824,881 B2 | 11/2017 | Niskanen et al. |
| 9,905,416 B2 | 2/2018 | Niskanen et al. |
| 2001/0012701 A1 | 8/2001 | Kang et al. |
| 2002/0061659 A1 | 5/2002 | Abe |
| 2002/0068466 A1 | 6/2002 | Lee et al. |
| 2002/0119327 A1 | 8/2002 | Arkles et al. |
| 2002/0151426 A1 | 10/2002 | Murata et al. |
| 2002/0180028 A1 | 12/2002 | Borovik et al. |
| 2003/0097987 A1 | 5/2003 | Fukuda |
| 2003/0215570 A1 | 11/2003 | Seutter et al. |
| 2003/0228770 A1 | 12/2003 | Lee et al. |
| 2004/0121085 A1 | 6/2004 | Wang et al. |
| 2004/0146644 A1 | 7/2004 | Xiao et al. |
| 2004/0224089 A1 | 11/2004 | Singh et al. |
| 2005/0000430 A1 | 1/2005 | Jang et al. |
| 2005/0025885 A1 | 2/2005 | McSwiney et al. |
| 2005/0145177 A1 | 7/2005 | McSwiney et al. |
| 2005/0159017 A1 | 7/2005 | Kim et al. |
| 2005/0181633 A1* | 8/2005 | Hochberg ............... C23C 16/24 |
| | | | 438/787 |
| 2005/0282350 A1 | 12/2005 | Chou et al. |
| 2006/0019032 A1 | 1/2006 | Wang et al. |
| 2006/0084283 A1 | 4/2006 | Paranjpe et al. |
| 2006/0148271 A1 | 7/2006 | Borovik et al. |
| 2006/0213437 A1 | 9/2006 | Ishizaka et al. |
| 2007/0026540 A1 | 2/2007 | Nooten et al. |
| 2007/0116888 A1 | 5/2007 | Faguet |
| 2007/0232071 A1 | 10/2007 | Balseanu et al. |
| 2007/0251444 A1 | 11/2007 | Gros-Jean et al. |
| 2008/0020591 A1 | 1/2008 | Balseanu et al. |
| 2008/0020593 A1 | 1/2008 | Wang et al. |
| 2008/0050523 A1 | 2/2008 | Kitazoe et al. |
| 2008/0146033 A1 | 6/2008 | Park |
| 2008/0242077 A1 | 10/2008 | Clark |
| 2008/0242116 A1 | 10/2008 | Clark |
| 2008/0274605 A1 | 11/2008 | Hoshi et al. |
| 2008/0292798 A1 | 11/2008 | Huh et al. |
| 2009/0155606 A1 | 6/2009 | Yoon et al. |
| 2009/0163041 A1 | 6/2009 | Mungekar et al. |
| 2009/0246972 A1 | 10/2009 | Kher et al. |
| 2009/0263972 A1 | 10/2009 | Balseanu et al. |
| 2009/0269941 A1 | 10/2009 | Raisanen et al. |
| 2009/0275210 A1 | 11/2009 | Shanker et al. |
| 2009/0311857 A1 | 12/2009 | Todd et al. |
| 2010/0041243 A1 | 2/2010 | Cheng et al. |
| 2010/0124621 A1 | 5/2010 | Kobayashi et al. |
| 2010/0184302 A1 | 7/2010 | Lee et al. |
| 2010/0285237 A1 | 11/2010 | Ditizio et al. |
| 2010/0304047 A1 | 12/2010 | Yang et al. |
| 2010/0304574 A1 | 12/2010 | Nodera et al. |
| 2011/0014795 A1 | 1/2011 | Lee et al. |
| 2011/0086516 A1 | 4/2011 | Lee et al. |
| 2011/0129990 A1 | 6/2011 | Mandrekar et al. |
| 2011/0136343 A1 | 6/2011 | Wang et al. |
| 2011/0136347 A1 | 6/2011 | Kovarsky et al. |
| 2011/0183528 A1 | 7/2011 | Wang et al. |
| 2011/0244690 A1 | 10/2011 | Shanker et al. |
| 2011/0256734 A1 | 10/2011 | Hausmann et al. |
| 2012/0009802 A1 | 1/2012 | LaVoie et al. |
| 2012/0021127 A1 | 1/2012 | Sato et al. |
| 2012/0021138 A1 | 1/2012 | Ditizio et al. |
| 2012/0028454 A1 | 2/2012 | Shankar et al. |
| 2012/0028469 A1 | 2/2012 | Onizawa et al. |
| 2012/0077350 A1 | 3/2012 | Miya et al. |
| 2012/0153442 A1 | 6/2012 | Honda et al. |
| 2012/0164848 A1 | 6/2012 | Fujii et al. |
| 2012/0178264 A1 | 7/2012 | Murakami et al. |
| 2012/0196048 A1* | 8/2012 | Ueda ..................... C23C 16/325 |
| | | | 427/532 |
| 2012/0196450 A1 | 8/2012 | Balseanu et al. |
| 2012/0213940 A1 | 8/2012 | Mallick |
| 2012/0220139 A1* | 8/2012 | Lee ....................... C23C 16/345 |
| | | | 438/792 |
| 2012/0295449 A1 | 11/2012 | Fukazawa |
| 2013/0040447 A1 | 2/2013 | Swaminathan et al. |
| 2013/0065371 A1 | 3/2013 | Wei et al. |
| 2013/0078392 A1 | 3/2013 | Xiao et al. |
| 2013/0084714 A1 | 4/2013 | Oka et al. |
| 2013/0095664 A1 | 4/2013 | Matero et al. |
| 2013/0115374 A1 | 5/2013 | Jayakar et al. |
| 2013/0115763 A1 | 5/2013 | Takamure et al. |
| 2013/0157466 A1 | 6/2013 | Fox et al. |
| 2013/0171839 A1 | 7/2013 | Nguyen et al. |
| 2013/0175621 A1 | 7/2013 | Chen et al. |
| 2013/0183835 A1 | 7/2013 | Nguyen et al. |
| 2013/0189854 A1* | 7/2013 | Hausmann ........... H01L 21/0217 |
| | | | 438/792 |
| 2013/0224964 A1 | 8/2013 | Fukuzawa et al. |
| 2013/0244446 A1 | 9/2013 | Tsuji et al. |
| 2013/0323435 A1 | 12/2013 | Xiao et al. |
| 2013/0330933 A1 | 12/2013 | Fukuzawa et al. |
| 2014/0023794 A1 | 1/2014 | Mahajani et al. |
| 2014/0030444 A1 | 1/2014 | Swaminathan et al. |
| 2014/0051263 A1 | 2/2014 | Tanaka et al. |
| 2014/0073144 A1 | 3/2014 | Chatterjee et al. |
| 2014/0113457 A1 | 4/2014 | Sims et al. |
| 2014/0124841 A1 | 5/2014 | Xie et al. |
| 2014/0141625 A1 | 5/2014 | Fukazawa et al. |
| 2014/0174353 A1 | 6/2014 | Spangler et al. |
| 2014/0193983 A1 | 7/2014 | LaVoie |
| 2014/0227458 A1 | 8/2014 | Karakawa |
| 2014/0273477 A1 | 9/2014 | Niskanen et al. |
| 2014/0273527 A1 | 9/2014 | Niskanen et al. |
| 2014/0273528 A1 | 9/2014 | Niskanen et al. |
| 2014/0273529 A1* | 9/2014 | Nguyen ............... H01L 21/0217 |
| | | | 438/792 |
| 2014/0273530 A1* | 9/2014 | Nguyen ............... H01L 21/0217 |
| | | | 438/792 |
| 2014/0273531 A1 | 9/2014 | Niskanen et al. |
| 2014/0287164 A1 | 9/2014 | Xiao et al. |
| 2014/0342573 A1 | 11/2014 | Hirose et al. |
| 2014/0363980 A1 | 12/2014 | Kawamata et al. |
| 2015/0031218 A1 | 1/2015 | Karakawa |
| 2015/0104954 A1 | 4/2015 | Pore |
| 2015/0104955 A1 | 4/2015 | Pore |
| 2015/0162185 A1 | 6/2015 | Pore |
| 2015/0206719 A1 | 7/2015 | Swaminathan et al. |
| 2015/0255324 A1 | 9/2015 | Li et al. |
| 2015/0259791 A1 | 9/2015 | Hausmann et al. |
| 2015/0287591 A1 | 10/2015 | Pore et al. |
| 2017/0062204 A1 | 3/2017 | Suzuki et al. |
| 2017/0372886 A1 | 12/2017 | Chen et al. |
| 2018/0068844 A1 | 3/2018 | Chen et al. |
| 2018/0182613 A1 | 6/2018 | Blanquart et al. |

FOREIGN PATENT DOCUMENTS

| | | |
|---|---|---|
| JP | 2006-190770 | 7/2006 |
| JP | 2010-103484 | 5/2010 |
| JP | 2012-138641 | 7/2012 |
| JP | 2012-216873 | 8/2012 |
| JP | 2013-125762 | 6/2013 |

(56) References Cited

FOREIGN PATENT DOCUMENTS

| KR | 101491726 | 2/2015 |
|---|---|---|
| WO | WO 2012144523 A1 | 10/2012 |
| WO | WO 2013/121936 | 8/2013 |

OTHER PUBLICATIONS

Keinan et al., "Diiodosilane. 2. A Multipurpose Reagent for Hydrolysis and Reductive Iodination of Ketals, Acetals, Ketones, and Aldehydes," J. Org. Chem., 1990, vol. 55, pp. 2927-2938.
Keinan et al., "Diiodosilane. 3. Direct Synthesis of Acyl Iodides from Carboxylic Acids, Esters, Lactones, Acyl Chlorides, and Anhydrides," J. Org. Chem., 1990, vol. 55, pp. 3922-3926.
Tamizhmani et al., "Physical Characterization of a-Si Thin Films Deposited by Thermal Decomposition of Iodosilanes," J. Phys.D: Appl. Phys., 1991, vol. 23, pp. 1015-1021.
Tamizhmani et al., "Some Physical Properties of Undoped Amorphous Silicon Prepared by a New Chemical Vapor Deposition Process Using Iodosilanes," Chem. Mater., 1990, vol. 2, pp. 473-476.
Cho, Namtae, "Processing of Boron Carbide," Ph.D. Thesis, School of Materials Science and Engineering, Georgia Institute of Technology, 2006, in 89 pages.
Domnich, et al., "Boron Carbide: Structures, Properties, and Stability under Stress," J. Am. Ceram. Soc., vol. 94., No. 11, 2011, pp. 3605-3628.
Final Office Action dated Feb. 24, 2015 in U.S. Appl. No. 14/167,904.
Lowenstein et al., "Chemical Etching of Thermally Oxidized Silicon Nitride: Comparison of Wet Dry Etching Methods," Journal of the Electrochemical Society 138.5, 1991, pp. 1389-1394.
Office Action dated Jun. 17, 2014 in U.S. Appl. No. 14/167,904.
Office Action dated Jun. 5, 2014 in U.S. Appl. No. 14/062,328.
Office Action dated Oct. 6, 2015 in U.S. Appl. No. 14/167,904.
Pedersen, et al. "Low Temperature CVD of Thin, Amorphous Boron-Carbon Films for Neutron Detectors," 2012, Chemical Vapor Deposition, (18), 7-9, 221-224.
Sarubbi, et al., "Pure Boron-Doped Photodiodes: a Solution for Radiation Detection in EUV Lithography," ESSDERC 2008—38th European Solid-State Device Research Conference, 2008, pp. 278-281.
Triyoso et al., "Robust PEALD SiN spacer for gate first high-k metal gate integration", IEEE, 2012, 4 pages.
Final Office Action dated Feb. 12, 2015 in U.S. Appl. No. 13/830,084.
Knoops, Harm C.M. et al. "Plasma-assisted ALD of Silicon Nitride from BTBAS," 131h International Conference on Atomic Layer Deposition, Jul. 28-31, 2013, San Diego, California, U.S.A., 21 pages.
Office Action dated Jun. 12, 2014 in U.S. Appl. No. 13/830,084.
Office Action dated Oct. 5, 2015 in U.S. Appl. No. 13/830,084.
Final Office Action dated Mar. 23, 2016 in U.S. Appl. No. 14/167,904.
File History of U.S. Appl. No. 13/830,084, filed Mar. 14, 2013.
File History of U.S. Appl. No. 14/062,328, filed Oct. 24, 2013.
File History of U.S. Appl. No. 14/167,904, filed Jan. 29, 2014.
Lin et al., "Silicon Nitride Films Deposited by Atmospheric Pressure Chemical Vapor Deposition", Mat. Res. Soc. Symp. Proc. vol. 495, 1998 Materials Research Society, pp. 107-112.
File History of U.S. Appl. No. 15/703,241, filed Sep. 13, 2017.
File History of U.S. Appl. No. 15/414,485, filed Jan. 24, 2017.
File History of U.S. Appl. No. 15/902,300, filed Feb. 22, 2018.
File History of U.S. Appl. No. 14/855,261, filed Sep. 15, 2015.
File History of U.S. Appl. No. 15/426,593, filed Feb. 7, 2017.
File History of U.S. Appl. No. 15/706,435, filed Sep. 15, 2017.
File History of U.S. Appl. No. 16/381,634, filed Apr. 11, 2019.
File History of U.S. Appl. No. 15/966,717, filed Apr. 30, 2018.

\* cited by examiner

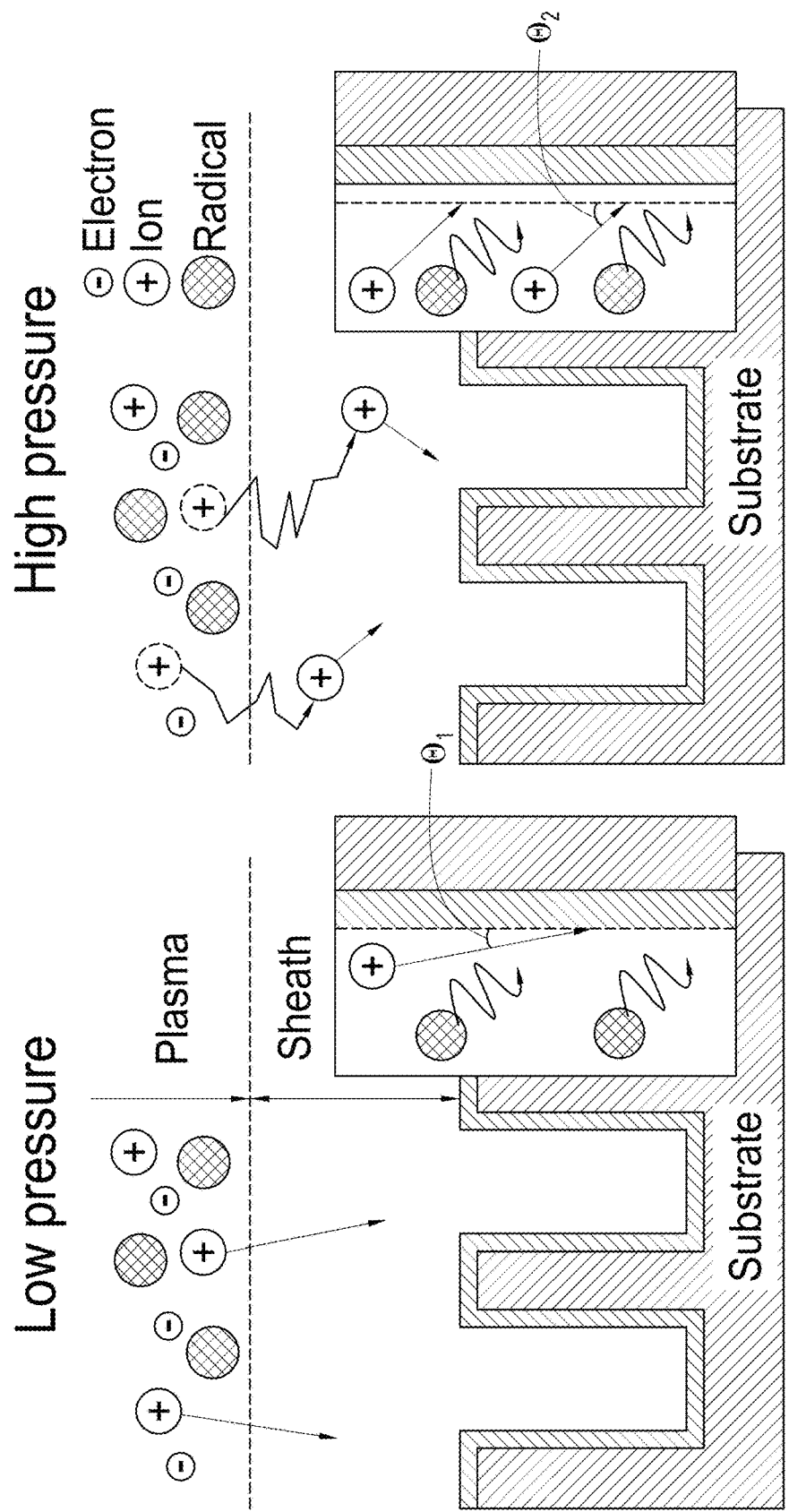

(Process A x n cycle + Process B x 1 cycle) x m cycle
Film formation    Conformal film improvement

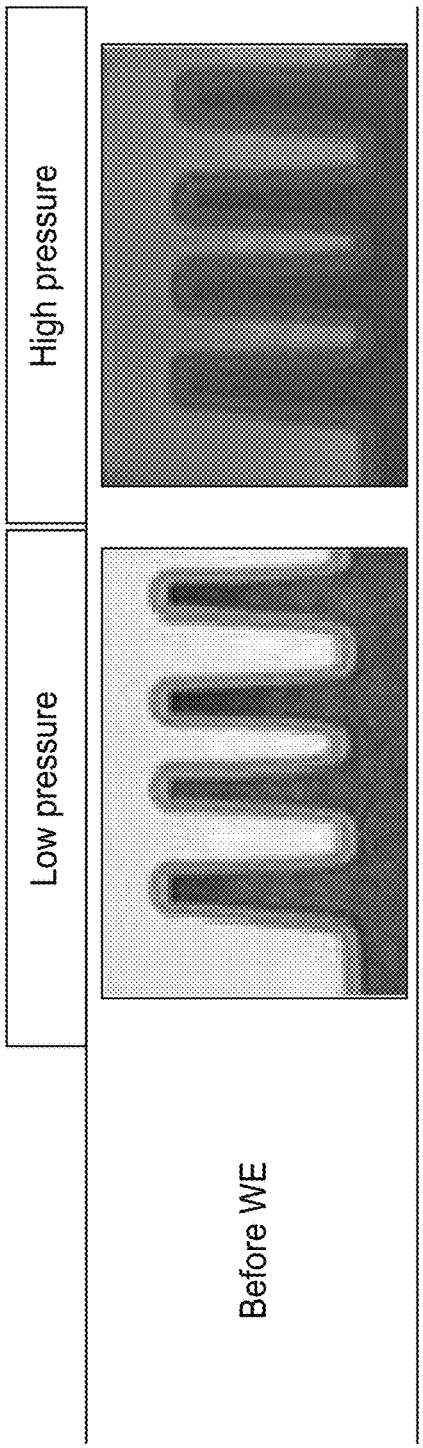
FIG. 6A  Low pressure
FIG. 6C  High pressure
Before WE
THK Conformality: 69% / 92%
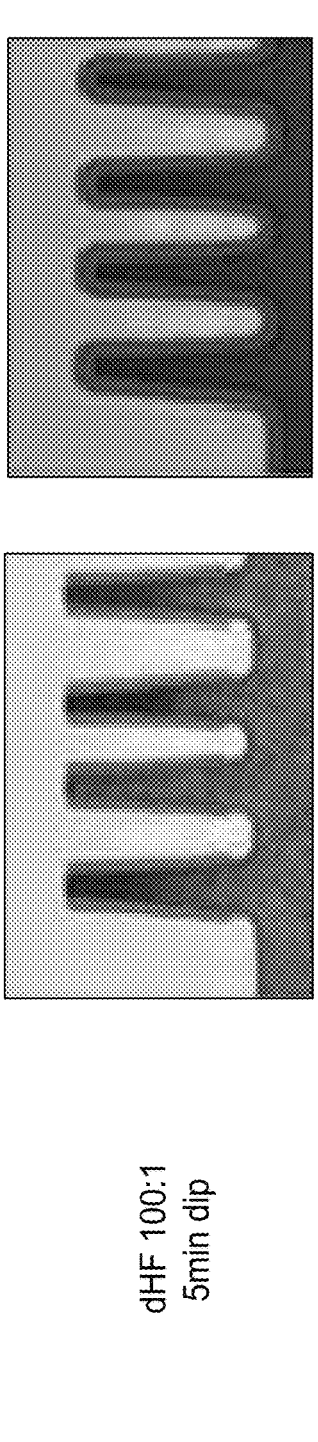
dHF 100:1 5min dip
Top/Side WER (nm/min): >1.55/0.26 / 0.32/0.32
WER Conformality: 0.17 / 1.00
FIG. 6B / FIG. 6D

FORMATION OF SIN THIN FILMS

BACKGROUND

Field

The present disclosure relates generally to the field of semiconductor device manufacturing and, more particularly, to low temperature formation of silicon nitride thin films.

Description of the Related Art

Spacers are widely used in semiconductor manufacturing as structures to protect against subsequent processing steps. For example, nitride spacers formed beside gate electrodes can be used as a mask to protect underlying source/drain areas during doping or implanting steps.

As the physical geometry of semiconductor devices shrinks, the gate electrode spacer becomes smaller and smaller. The spacer width is limited by the nitride thickness that can be deposited conformably over the dense gate electrodes lines. Thus, the nitride spacer etching process is preferred to have a high ratio of spacer width to nitride layer thickness as deposited.

Current PEALD silicon nitride processes in general suffer from anisotropic etch behavior when used to deposit on a three-dimensional structure, such as a trench structure. In other words, the film deposited on the sidewalls of a trench or fin or another three dimensional feature display inferior film properties as compared to film on the top region of the feature. The film quality may be sufficient for the target application on the top of the trench, or on planar regions of a structured wafer, but not on the sidewalls or other non-horizontal or vertical surfaces.

FIGS. 1A and 1B illustrate a typical example of a silicon nitride film, which could be used, for example, in spacer applications. The film was deposited at 400° C. using a conventional PEALD process, not a process described in the present application. FIG. 1A illustrates the film after it was deposited on a three-dimensional surface but prior to being etched by HF. An etching process was then performed by dipping the workpiece in 0.5% BF for about 60 seconds. FIG. 1B illustrates the extent to which vertical portions of the silicon nitride film etch to a greater extent than the horizontal portions of the film. The film thicknesses are indicated in nanometers. Structures such as these would not generally survive further processing, such as in a FinFET spacer application.

SUMMARY

In some aspects, atomic layer deposition (ALD) methods of forming silicon nitride films are provided. In some aspects, plasma enhanced atomic layer deposition (PEALD) methods of forming silicon nitride films are provided. The methods allow for the deposition of silicon nitride films with desirable qualities, such as good step coverage and pattern loading effects, as well as desirable etch characteristics. According to some embodiments, the silicon nitride films have a relatively uniform etch rate for both the vertical and the horizontal portions, when deposited onto 3-dimensional structures. In some embodiments the wet etch rates of silicon nitride deposited on the vertical and horizontal portions of the three dimensional structure are approximately equal. Such three-dimensional structures may include, for example and without limitation, FinFETS or other types of multiple gate FETs. In some embodiments, various silicon nitride films of the present disclosure have an etch rate of less than half the thermal oxide removal rate of about 2-3 nm per minute with diluted BF (0.5%).

In some embodiments, methods of forming a silicon nitride thin film on a substrate in a reaction space can include a plasma enhanced atomic layer deposition (PEALD) process. The PEALD process may include at least one PEALD deposition cycle including contacting a surface of the substrate with a vapor phase silicon precursor to provide adsorbed silicon species on the surface of the substrate and contacting the adsorbed silicon species with nitrogen plasma to form silicon nitride on the surface of the substrate. In some embodiments the silicon precursor is a silicon halide. In some embodiments the silicon halide may comprise iodine, and may be, for example $H_2SiI_2$. The pressure in the reaction space during the contacting steps can be at least about 20 Torr.

In some embodiments, the silicon nitride thin film is deposited on a three-dimensional structure on the substrate, and a wet etch rate ratio of a portion of the silicon nitride thin film formed on a top surface of the three-dimensional structure to a portion of the silicon nitride thin film formed on a sidewall surface of the three-dimensional structure is about 1:1.

In some embodiments, the nitrogen plasma is formed using a plasma power of about 500 Watts (W) to about 1000 W. In some embodiments, the contacting steps are carried out at a process temperature of about 100° C. to about 650° C.

In some embodiments methods of forming a silicon nitride thin film on a substrate in a reaction space can include a plurality of atomic layer deposition (ALD) cycles. At least one of the ALD deposition cycles can include contacting a surface of the substrate with a vapor phase silicon precursor to provide adsorbed silicon species on the surface of the substrate, and contacting the adsorbed silicon species with nitrogen reactants to form silicon nitride on the surface of the substrate. The pressure in the reaction space during the contacting steps can be at least about 20 Torr. In some embodiments, the process pressure within the reaction space is about 30 Torr to about 500 Torr. In some embodiments, the contacting steps can be carried out at a process temperature of about 100° C. to about 650° C.

In some embodiments, the vapor phase silicon precursor can include a silyl halide. In some embodiments, the vapor phase silicon precursor comprises iodine, and may be, for example, $H_2SiI_2$.

In some embodiments, the silicon nitride thin film is deposited on a three-dimensional structure on the surface of the substrate. A wet etch rate ratio of a portion of the silicon nitride thin film formed on a top surface of the three-dimensional structure to a portion of the silicon nitride thin film formed on a sidewall surface of the three-dimensional structure can be about 1:1. In some embodiments, In some embodiments, the at least one atomic layer deposition cycle comprises a plasma enhanced atomic layer deposition (PEALD) cycle. The nitrogen reactants can be generated by a plasma using a nitrogen precursor. In some embodiments, the nitrogen plasma is formed from nitrogen gas ($N_2$). In some embodiments, the nitrogen gas ($N_2$) flows continuously throughout the PEALD deposition cycle.

In some embodiments, excess vapor phase silicon precursors can be removed between contacting the surface of the substrate with the vapor phase silicon precursor and contacting the adsorbed silicon species with the nitrogen reactants. In some embodiments, a purge gas can be flowed between contacting the surface of the substrate with a vapor phase silicon precursor and contacting the adsorbed silicon species with the nitrogen reactants.

In some embodiments, methods of forming a silicon nitride thin film on a substrate in a reaction space can include a plurality of super-cycles including a plurality of silicon nitride deposition sub-cycles comprising alternately and sequentially contacting the substrate with a silicon precursor and a nitrogen plasma; and a plurality of high-pressure treatment sub-cycles, where at least one of the plurality of high-pressure treatment sub-cycles includes contacting the substrate with a nitrogen plasma at a pressure of greater than about 20 Torr. In some embodiments, the pressure is about 20 Torr to about 500 Torr. In some embodiments, the pressure is about 20 Torr to about 30 Torr. In some embodiments the pressure is greater than 30 Torr, or between 30 Torr and 500 Torr.

In some embodiments, the silicon precursor is $H_2SiI_2$. In some embodiments, the nitrogen-containing plasma is generated from a nitrogen precursor selected from the group consisting of $NH_3$, $N_2H_4$, an $N_2/H_2$ mixture, $N_2$, and any mixtures thereof.

In some embodiments, the silicon nitride thin film is deposited on a three-dimensional structure on the substrate. A wet etch rate ratio of a wet etch rate of silicon nitride formed on a top surface of the three-dimensional structure to a wet etch rate of the silicon nitride formed on a sidewall surface of the three-dimensional structure is 1:1.

In some embodiments, the at least one silicon nitride deposition sub-cycle can include flowing a carrier gas throughout the at least one silicon nitride deposition sub-cycle. In some embodiments, the at least one silicon nitride deposition sub-cycle further includes flowing a hydrogen-containing gas and a nitrogen-containing gas throughout the at least one silicon nitride deposition sub-cycle.

In some embodiments, the hydrogen-containing gas and the nitrogen-containing gas are used to form the nitrogen-containing plasma. In some embodiments, the at least one high-pressure treatment sub-cycle includes flowing a carrier gas throughout the at least one high-pressure treatment sub-cycle.

BRIEF DESCRIPTION OF THE DRAWINGS

The invention will be better understood from the Detailed Description of the Preferred Embodiments and from the appended drawings, which are meant to illustrate and not to limit the invention, and wherein:

FIGS. 3A and 3B are schematic diagrams showing exemplary ion incident angles upon vertical surfaces of a three-dimensional structure of ions generated by a lower pressure plasma and a higher pressure plasma, respectively.

FIGS. 6A-6D are scanning electron microscope (SEM) images showing cross-sectional views of SiN films formed on trench structures prior to and after exposure of the films to a wet etch dip. FIGS. 6A and 6B illustrate conformality and wet etch of films formed using low pressure, while FIGS. 6C and 6D illustrate conformality and wet etch of films deposited according to one or more embodiments described herein.

DETAILED DESCRIPTION

Figure 1A:
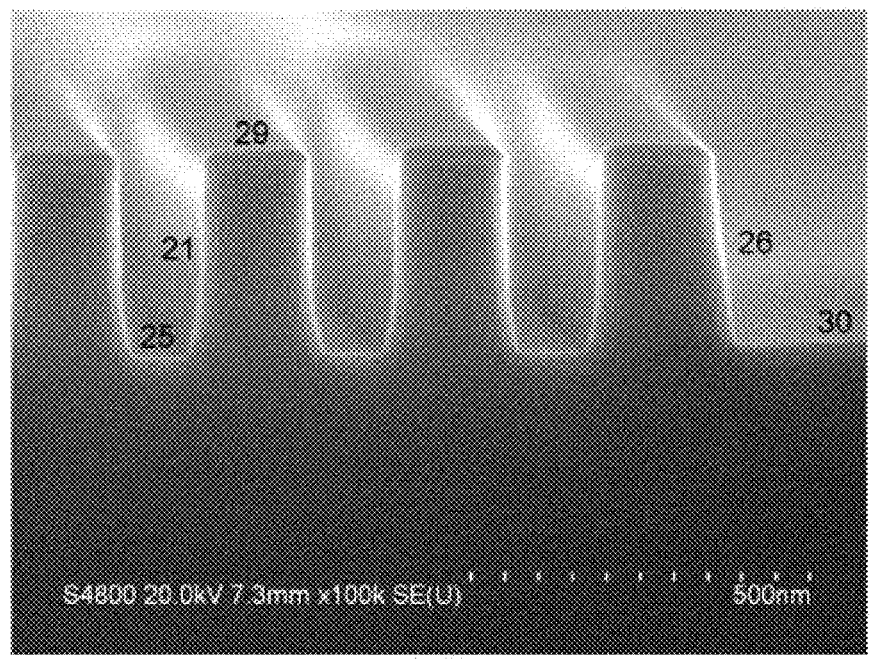
FIGS. 1A and 1B illustrate a silicon nitride film deposited by a conventional method and the results of an etching process performed on the silicon nitride film.
Figure 1B:
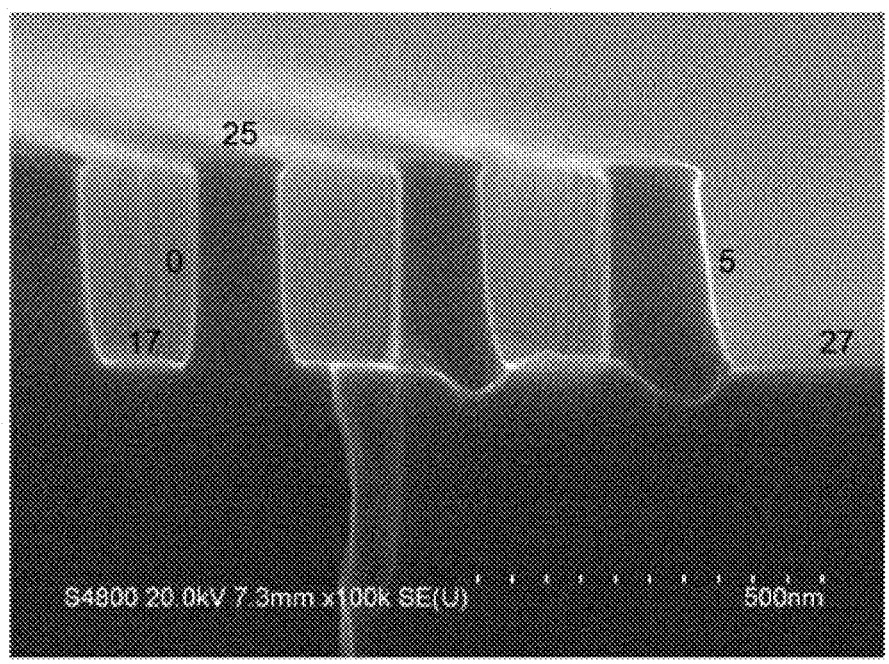

Silicon nitride films have a wide variety of applications, as will be apparent to the skilled artisan, such as in planar logic, DRAM, and NAND Flash devices. More specifically, conformal silicon nitride thin films that display uniform etch behavior have a wide variety of applications, both in the semiconductor industry and also outside of the semiconductor industry. According to some embodiments of the present disclosure, various silicon nitride films and precursors and methods for depositing those films by atomic layer deposition (ALD) are provided. Importantly, in some embodiments the silicon nitride films have a relatively uniform etch rate for both vertical and horizontal portions, when deposited onto 3-dimensional structures. Such three-dimensional structures may include, for example and without limitation, FinFETS or other types of multiple gate FETs. In some embodiments, various silicon nitride films of the present disclosure have an etch rate of less than half the thermal oxide removal rate of about 2-3 nm per minute with diluted BF (0.5%).

In some embodiments, silicon nitride thin films are deposited on a substrate by plasma-enhanced atomic layer deposition (PEALD) processes. In some embodiments a silicon nitride thin film is deposited over a three dimensional structure, such as a fin in the formation of a finFET device.

The formula of the silicon nitride films is generally referred to herein as SiN for convenience and simplicity. However, the skilled artisan will understand that the actual formula of the silicon nitride, representing the Si:N ratio in the film and excluding hydrogen or other impurities, can be represented as $SiN_x$, where x varies from about 0.5 to about 2.0, as long as some Si—N bonds are formed. In some cases, x may vary from about 0.9 to about 1.7, from about 1.0 to about 1.5, or from about 1.2 to about 1.4. In some embodiments silicon nitride is formed where Si has an oxidation state of +IV and the amount of nitride in the material might vary.

In some embodiments, a high pressure PEALD process is used to deposit SiN thin films. A substrate on which the SiN film is to be deposited is alternately and sequentially contacted with a silicon precursor and a nitrogen reactant, where the nitrogen reactant comprises reactive species generated by a plasma using a nitrogen precursor. The high pressure process can comprise a plurality of deposition cycles, wherein at least one deposition cycle is performed in an elevated pressure regime. For example, a deposition cycle of a high pressure PEALD process may comprise alternately and sequentially contacting the substrate with a silicon precursor and a nitrogen reactant under the elevated pressure. In some embodiments, one or more deposition cycles of the PEALD process can be performed at a process pressure of about 6 Torr to about 500 Torr, about 6 Torr to about 50 Torr, or about 6 Torr to about 100 Torr. In some embodiments, the one or more deposition cycles can be performed at a process pressure of greater than about 20 Torr, including about 20 Torr to about 500 Torr, about 30 Torr to about 500 Torr, about 40 Torr to about 500 Torr, or about 50 Torr to about 500 Torr. In some embodiments, the one or more deposition cycles can be performed at a process pressure of about 20 Torr to about 30 Torr, about 20 Torr to about 100 Torr, about 30 Torr to about 100 Torr, about 40 Torr to about 100 Torr or about 50 Torr to about 100 Torr.

In some embodiments, a high pressure PEALD process used to deposit SiN thin films can include one or more deposition cycles comprising contacting the substrate with the silicon precursor at a conventional process pressure and contacting the silicon species adsorbed on the substrate with a nitrogen reactant, such as a nitrogen plasma, under an elevated pressure regime. For example, one or more deposition cycles of a high pressure PEALD process may comprise contacting the substrate with a silicon precursor at a process pressure of about 0.1 Torr to about 5 Torr, such as at about 3 Torr or lower, and contacting the adsorbed silicon species with a nitrogen reactant at a process pressure of about 6 Torr to about 500 Torr, about 20 Torr to about 500 Torr, about 30 Torr to about 500 Torr, about 40 Torr to about 500 Torr, or about 50 Torr to about 500 Torr. In some embodiments, contacting the adsorbed silicon species with the nitrogen reactant can be performed at a process pressure of about 20 Torr to about 30 Torr, about 20 Torr to about 100 Torr, about 30 Torr to about 100 Torr, about 40 Torr to about 100 Torr or about 50 Torr to about 100 Torr.

In some embodiments, the high-pressure PEALD process may utilize a silyl halide as the silicon precursor. In some embodiments, the silicon precursor comprises iodine. In some embodiments, the silicon precursor is $H_2SiI_2$.

In some embodiments the nitrogen precursor for the high-pressure PEALD process comprises nitrogen plasma. For example, the second precursor may comprise N, NH or $NH_2$ radicals. In some embodiments the nitrogen plasma may be generated from $N_2$, for example from a mixture of $N_2$ and $H_2$. In some embodiments however, no hydrogen plasma is utilized. Nitrogen plasma may be generated, for example, at a power of about 10 W to about 2,000 W, about 50 W to about 1000 W, about 100 W to about 1000 W or about 500 W to about 1000 W. For example, the nitrogen plasma can be generated at a power of about 800 W to about 1000 W.

In some embodiments, the high-pressure PEALD process can be performed at a process temperature of about 100° C. to about 650° C. In some embodiments the PEALD process can be performed at a process temperature of about 100° C. to about 550° C. or about 100° C. to about 450° C.

For example, in some embodiments, each of a plurality of deposition cycles of a high-pressure PEALD process may be performed in the elevated pressure regime of about 6 Torr to about 500 Torr, preferably about 20 Torr to about 500 Torr, and more preferably about 30 Torr to about 500 Torr, at a temperature of about 100° C. to about 650° C., and using a silyl halide, such as $H_2SiI_2$ as the silicon precursor. In some embodiments at least one of the plurality of deposition cycles is performed under these conditions. For example, one or more high pressure deposition cycles may be performed intermittently during deposition of a silicon nitride film, with the remaining deposition cycles being performed at conventional pressure.

SiN thin films formed on three-dimensional structures using such deposition processes can advantageously demonstrate desired uniformity in characteristics between portions of the films formed on horizontal surfaces (e.g., top surfaces) and vertical surfaces (e.g., sidewall surfaces) of the structure. For example, SiN thin films formed using such PEALD processes can advantageously demonstrate increased uniformity in wet etch rates (WER), film thicknesses, density, and/or purity, between SiN film formed on horizontal surfaces and vertical surfaces of a three-dimensional structure. In some embodiments, such a PEALD process can advantageously provide SiN thin films having desired wet etch rate ratios (WERR). As used herein, a wet etch rate ratio refers to a ratio of an etch rate of SiN film formed on a horizontal surface (e.g., a top surface) to an etch rate of the SiN film formed on a vertical surface (e.g., a sidewall surface). For example, a wet etch rate of SiN thin film deposited using a high-pressure PEALD process described herein can demonstrate the same or substantially the same WER on both vertical and horizontal surfaces, for example providing a wet etch rate ratio (WERR) of about 1 when exposed to dilute HF (0.5 weight % aqueous solution). In some embodiments, the ratio can be about 0.25 to about 2, about 0.5 to about 1.5, about 0.75 to about 1.25, or about 0.9 to about 1.1. In some embodiments, these ratios can be achieved in aspect ratios of more than about 2, preferably in aspect ratios more than about 3, more preferably in aspect ratios more than about 5 and most preferably in aspect ratios more than about 8. In some embodiments, such a PEALD process can advantageously provide SiN thin films having the same or substantially the same thickness on both vertical and horizontal surfaces. Without wishing to be held to any particular theory, it is believed that in some embodiments, a SiN PEALD process performed in an elevated pressure regime may advantageously reduce anisotropy of ion bombardment by increasing collision between the ions of the plasma, thereby reducing differences in one or more characteristics of SiN film formed on horizontal and vertical surfaces of a three-dimensional structure.

In some embodiments, SiN can be deposited using at least one lower pressure deposition cycle, and subsequently treated by a high-pressure treatment process, to provide SiN thin films having desired characteristics. In some embodiments, a process for forming SiN thin films can include one or more silicon nitride deposition sub-cycles and one or more high-pressure treatment sub-cycles. In some embodiments, the one or more silicon nitride deposition sub-cycles deposits SiN on the substrate at conventional pressure and the one or more high-pressure treatment sub-cycles can be provided intermittently and advantageously improve one or more characteristics of the deposited SiN to provide a SiN thin film having one or more desired characteristics, such as an improved wet etch rate ratio. The high pressure treatment sub-cycle can be provided after each silicon nitride deposition sub-cycle, or intermittently, such as at regular intervals during the deposition process, for example after every 2, 3, 4, 5, 10, 20 etc. . . . cycles.

A silicon nitride deposition sub-cycle may comprise a PEALD process performed at a conventional deposition pressure, followed by a high-pressure treatment process comprising a plasma step performed at a pressure significantly higher than the conventional deposition pressure. For example, the PEALD process can be performed at a process pressure of about 0.1 Torr to about 5 Torr, such as at about 3 Torr or lower or about 4 Torr or lower, and the high-pressure treatment sub-cycle can be performed at a process pressure of at least about 6 Torr, such as at least about 7 Torr, at least about 20 Torr, at least about 30 Torr, or at least about 40 Torr, including about 6 Torr to about 500 Torr, about 7 Torr to about 500 Torr, about 20 Torr to about 500 Torr, about 30 Torr to about 500 Torr, about 40 Torr to about 500 Torr, about 6 Torr to about 100 Torr, about 50 Torr to about 100 Torr, about 40 Torr to about 100 Torr, about 30 Torr to about 100 Torr, or about 20 Torr to about 100 Torr.

In some embodiments, the PEALD process may use a silyl halide, for example comprising iodine, such as $H_2SiI_2$, as a silicon precursor in combination with a nitrogen precursor, such as a nitrogen plasma. The high-pressure treatment process may comprise providing nitrogen plasma at the elevated pressure. In some embodiments, such a silicon nitride formation process can unexpectedly allow formation of conformal SiN films on three-dimensional structures having desired film characteristics on both vertical and horizontal surfaces. For example, such a silicon nitride formation process may unexpectedly reduce differences in quality between thin film formed on vertical and horizontal surfaces, including differences between wet etch rates (WER) and/or film thicknesses, while also providing a film having desired impurity levels. In some embodiments, such a silicon nitride formation process can advantageously provide SiN thin films having the same or substantially the same WER on both vertical and horizontal surfaces. In some embodiments, such a silicon nitride formation process can advantageously provide SiN thin films having the same or substantially the same thickness on both vertical and horizontal surfaces. In some embodiments, such a silicon nitride formation process can advantageously provide SiN thin films having desired uniformity in film density and/or impurity levels on both vertical and horizontal surfaces. For example, a ratio of a wet etch rate of a portion of the SiN thin formed on horizontal surfaces (e.g., top surfaces) of a three-dimension structure to that of a portion of the SiN film formed on vertical surfaces (e.g., sidewall surfaces) when exposed to dilute HF (0.5 weight % aqueous solution) can be about 1. In some embodiments, the ratio can be about 0.25 to about 2, about 0.5 to about 1.5, about 0.75 to about 1.25, or about 0.9 to about 1.1. These ratios can be achieved in aspect ratios, for example, of more than about 2, preferably in aspect ratios more than about 3, more preferably in aspect ratios more than about 5 and most preferably in aspect ratios more than about 8.

In some embodiments, a process for forming silicon nitride thin films can include one or more super cycles, each of the one or more super-cycles including one or more silicon nitride deposition sub-cycles and one or more high-pressure treatment sub-cycles. A super-cycle may include the one or more silicon nitride deposition sub-cycles followed by the one or more high-pressure treatment sub-cycles. In some embodiments, the super-cycle can be repeated a number of times to form a silicon nitride thin film of a desired thickness and having one or more desired characteristics. In some embodiments, the number of silicon nitride deposition sub-cycles and the number of high-pressure treatment sub-cycles of one super-cycle can be different from one or more other super cycles of a silicon nitride formation process comprising a plurality of super-cycles. In some embodiments, the number of silicon nitride deposition sub-cycles and the number of high-pressure treatment sub-cycles of one super-cycle can the same as one or more other super cycles of a silicon nitride formation process comprising a plurality of super-cycles. In some embodiments, a process for forming a silicon nitride film can include one super cycle, the super cycle including a number of silicon nitride deposition sub-cycles followed by a number of high-pressure treatment sub-cycles. The number of super cycles, and/or silicon nitride deposition sub-cycles and high-pressure treatment sub-cycles in a super cycle, can be selected to form a silicon nitride film having desired properties. As described herein, one or more processes described herein can provide a conformal SiN thin film over a three-dimensional structure, the SiN thin film formed on the three-dimensional structure also demonstrating desired uniformity in characteristics on both vertical and horizontal surfaces.

Formation of Silicon Nitride Thin Films

Figure 2A:
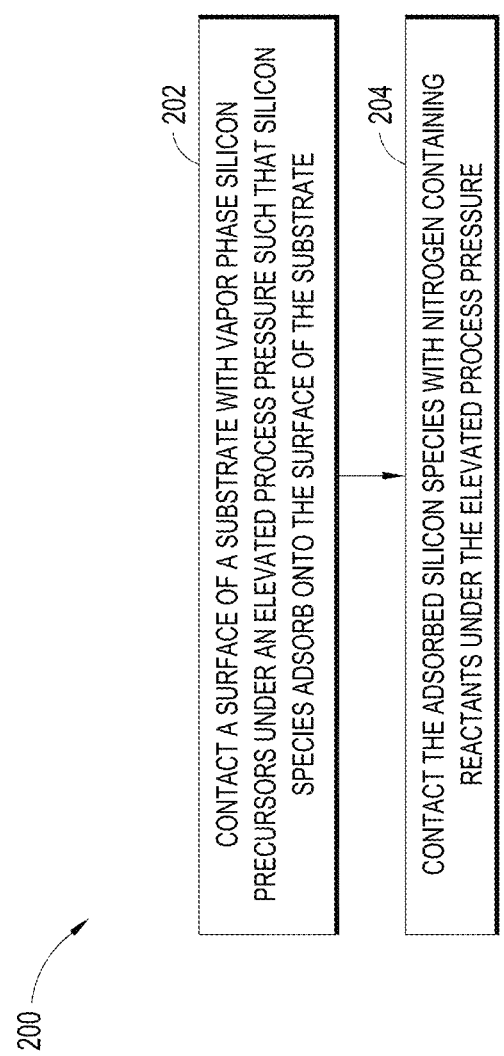
FIG. 2A is a flow chart illustrating a method of forming a silicon nitride thin film by a high pressure PEALD process in accordance with some embodiments of the present disclosure.

FIG. 2A is a flow chart generally illustrating a silicon nitride PEALD deposition cycle 200 performed under an elevated process pressure that can be used to deposit a silicon nitride thin film in accordance with some embodiments. According to certain embodiment, a silicon nitride thin film is formed on a substrate by a high-pressure PEALD-type process comprising multiple silicon nitride deposition cycles, each silicon nitride deposition cycle 200 comprising:

(1) contacting a surface of a substrate with vaporized silicon precursor under an elevated process pressure 202 such that silicon species adsorb onto the surface of the substrate;

(2) contacting the adsorbed silicon species with nitrogen-containing reactants under the elevated process pressure 204, thereby converting the adsorbed silicon species into silicon nitride.

In some embodiments, the nitrogen-containing reactants comprises reactants generated by a plasma from one or more nitrogen-containing precursors.

In some embodiments, the one or more nitrogen precursors may flow continuously throughout the cycle, with the nitrogen-containing plasma formed at the appropriate times to convert adsorbed silicon species into silicon nitride. For example, nitrogen gas ($N_2$) and/or hydrogen gas ($H_2$) may flow continuously throughout the cycle.

The contacting steps are repeated until a thin film of a desired thickness and composition is obtained. Excess reactants may be purged from the reaction space after each contacting step, i.e., steps 202 and 204.

In some embodiments, the silicon precursor of PEALD deposition cycle 200 may comprise a silyl halide. In some embodiments, the silicon precursor is $H_2SiI_2$.

In some embodiments, the high pressure PEALD process is performed at a temperature from about 100° C. to about 650° C., about 100° C. to about 550° C., about 100° C. to about 450° C., or about 200° C. to about 600° C. In some embodiments the temperature is about 300° C., or about 550° C. In some embodiments the temperature is about 400° C. to about 500° C. In some embodiments, the high pressure PEALD process is performed at a temperature of about 550° C. or about 600° C.

In some embodiments, one or both of the contacting steps (1) and (2) described with reference to FIG. 2A can be followed by a step in which excess reactants and/or reaction byproducts, if any, are removed from the vicinity of the substrate. For example, a purge step can follow one or both of the contacting steps (1) and (2).

As will be described in further details below, the high-pressure PEALD process for depositing the silicon nitride thin film can be performed at a process pressure of greater than about 6 Torr, or about 20 Torr. In some embodiments, the process pressure can be performed at a pressure of about 6 Torr to about 500 Torr, about 6 Torr to about 100 Torr, about 40 Torr to about 500 Torr, about 50 Torr to about 100 Torr, about 40 Torr to about 100 Torr, about 30 Torr to about 100 Torr, or about 20 Torr to about 100 Torr. In some embodiments, the process pressure can be about 20 Torr to about 50 Torr, or about 20 Torr to about 30 Torr. For example, one or more of the PEALD deposition cycles of the high-pressure PEALD process can be performed at a process pressure of about 20 Torr to about 500 Torr, including about 30 Torr to about 500 Torr. In some embodiments, the contacting steps (1) and (2) described with reference to FIG. 2A can be performed at such elevated pressures.

As will be described in further details below, the nitrogen-containing plasma described with reference to FIG. 2A can be generated using nitrogen-containing gas, including gas comprising compounds having both N and H, such as $NH_3$ and $N_2H_4$, a mixture of $N_2/H_2$ or other precursors having an N—H bond. In some embodiments, a plasma power used for generating the nitrogen-containing plasma can be about 10 Watts (W) to about 2,000 W, about 50 W to about 1000 W, about 100 W to about 1000 W or about 500 W to about 1000 W. In some embodiments, a plasma power used for generating the nitrogen-containing plasma can be about 800 W to about 1,000 W.

As described herein, in some embodiments, one or more deposition cycles or portions of a deposition cycle of a PEALD process for forming SiN can be performed at two different process pressures. In some embodiments, contacting the substrate with the silicon precursor can be performed at a process pressure of about 0.01 Torr to about 5 Torr, including about 0.1 Torr to about 5 Torr or about 1 Torr to about 5 Torr, while contacting the adsorbed silicon species can be performed under an elevated pressure regime as described herein. For example, contacting the adsorbed silicon species with nitrogen reactants can be performed at a process pressure of at least about 6 Torr, about 7 Torr, about 20 Torr, about 30 Torr or about 40 Torr. In some embodiments, the process pressure can be about 6 Torr to about 500 Torr, about 7 Torr to about 500 Torr, about 20 to about 500 Torr, about 6 Torr to about 100 Torr, about 20 Torr to about 100 Torr, or about 30 Torr to about 100 Torr.

Figure 2B:
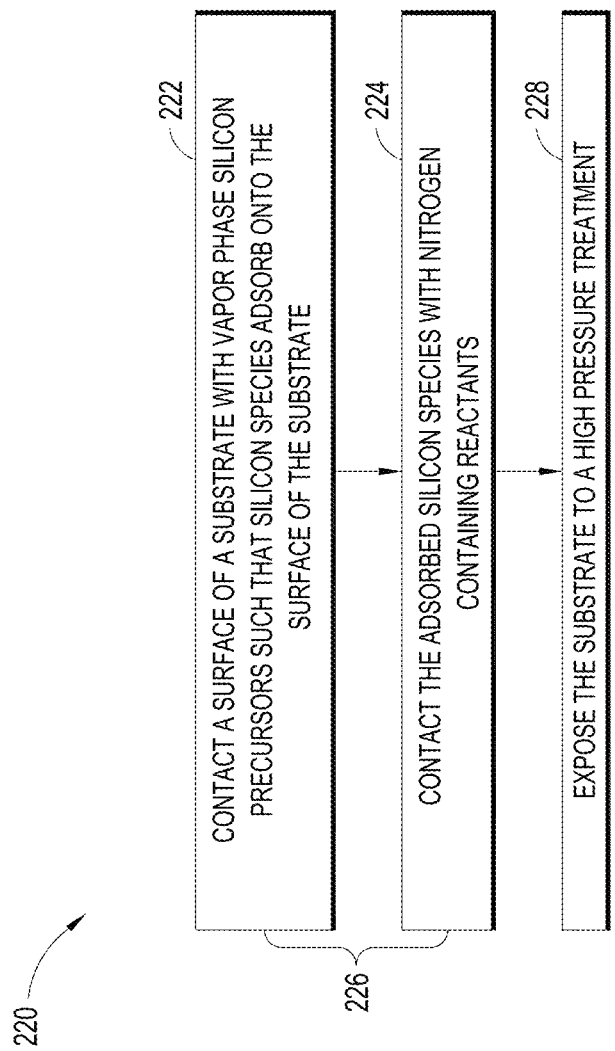
FIG. 2B is a flow chart illustrating a method of forming a silicon nitride thin film using a high-pressure treatment step in accordance with some embodiments of the present disclosure.

Referring to FIG. 2B, a flow chart generally illustrating a process for forming silicon nitride thin film according to another embodiment is shown. As described herein, in some embodiments, a process for forming a silicon nitride thin film can include one or more super-cycles 220, where each of the one or more super-cycles includes one or more silicon nitride deposition sub-cycles 226 and one or more high-pressure treatment sub-cycles 228. According to certain embodiment, a silicon nitride deposition sub-cycle 226 may comprise a PEALD process comprising:

(1) contacting a surface of a substrate with vaporized silicon precursors 222 such that silicon species adsorb onto the surface of the substrate;

(2) contacting the adsorbed silicon species with nitrogen reactants 204, thereby converting the adsorbed silicon compound into silicon nitride.

In some embodiments, the silicon nitride deposition sub-cycle 226 is performed at a process pressure of about 0.01 Torr to about 5 Torr, preferably from about 0.1 Torr to about 5 Torr, and more preferably from about 1 Torr to about 5 Torr. The one or more silicon nitride deposition sub-cycles 226 can be performed at a pressure significantly less than that applied in the PEALD process described with reference to FIG. 2A.

In some embodiments, the silicon precursor of the silicon nitride deposition sub-cycle 226 may comprise a silyl halide. In some embodiments, the silicon precursor is $H_2SiI_2$.

In some embodiments, the silicon nitride deposition sub-cycle 226 is performed at a temperature from about 100° C. to about 650° C., about 100° C. to about 550° C., about 100° C. to about 450° C., about 200° C. to about 600° C., about 300° C. and about 550° C., or at about 400° C. to about 500° C. In some embodiments, the silicon nitride deposition sub-cycle 226 is performed at a temperature of about 550° C. or about 600° C. The silicon nitride deposition sub-cycle 226 may be repeated a number of times to provide desired deposition of SiN.

As shown in FIG. 2B, the super-cycle 220 can include one or more high-pressure treatment sub-cycles 228. In some embodiments, the silicon nitride deposition sub-cycle 226 can be repeated a number of times in each of the one or more super-cycles 220 prior to performing one or more high-pressure treatment sub-cycles 228. The one or more high-pressure treatment sub-cycles 228 can be configured to improve one or more characteristics of the SiN deposited using the one or more silicon nitride deposition sub-cycles 226.

As will be described in further details below, a high-pressure treatment sub-cycle can include one or more plasma steps performed in an elevated pressure regime, such as a pressure of greater than about 6 Torr, about 20 Torr, about 30 Torr or about 50 Torr. In some embodiments, the plasma step can be performed at a pressure of about 20 Torr to about 500 Torr. In some embodiments, the one or more plasma steps can comprise a nitrogen-containing plasma free or substantially free of hydrogen-containing species. For example, the nitrogen-containing plasma can be generated using gas free or substantially free of hydrogen. For example, hydrogen-containing gas (e.g., hydrogen ($H_2$) gas) is not flowed to the reaction chamber during the one or more plasma steps of the high-pressure treatment sub-cycles 228. In some embodiments, the nitrogen-containing plasma is generated using nitrogen gas ($N_2$). In some embodiments, the high-pressure treatment sub-cycles 228 is performed at a temperature between about 100° C. to about 650° C., 100° C. to about 550° C., about 100° C. to about 450° C., about 200° C. to about 400° C., about 300° C. and about 400° C., or at about 400° C. A plasma power for a plasma step in a high-pressure treatment sub-cycle 228 can be about 100 Watts (W) to about 1,500 W, preferably from about 200 W to about 1,000 W, more preferably from about 500 W to about 1,000 W. For example, a high-pressure treatment process may have a plasma power of about 800 W.

PEALD of Silicon Nitride

As described herein, in some embodiments, a process for forming SiN thin films can be a PEALD process performed in an elevated process pressure regime. The process pressure for a high-pressure PEALD process can be greater than about 6 Torr, including greater than about 20 Torr, about 30 Torr or about 50 Torr. In some embodiments, the process pressure for a high-pressure PEALD process can be about 20 Torr to about 500 Torr, including about 30 Torr to about 500 Torr, about 20 Torr to about 100 Torr, 30 Torr to about 100 Torr, about 20 Torr to about 50 Torr, or about 30 Torr to about 50 Torr. In some embodiments, a process for forming SiN thin films can comprise a plurality of super-cycles which can include one or more silicon nitride deposition sub-cycles comprising PEALD processes performed at lower process pressures for depositing SiN in combination with one or more high pressure treatment sub-cycles. For example, PEALD processes for the one or more silicon nitride deposition sub-cycles can comprise a process pressure of about 0.01 Torr to about 5 Torr, preferably from about 0.1 Torr to about 3 Torr, and the one or more high-pressure treatment sub-cycles can comprise a process pressure of greater than about 20 Torr, including greater than about 30 Torr or about 50 Torr.

PEALD processes can be used to deposit SiN on substrates such as integrated circuit workpieces, and in some embodiments on three-dimensional structures on the substrates. Briefly, a substrate or workpiece is placed in a reaction chamber and subjected to alternately repeated surface reactions. In some embodiments, thin SiN films are formed by repetition of a self-limiting ALD cycle. ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity of the substrate surface with the aid of a purge gas and/or vacuum. In some embodiments excess reactants and/or reactant byproducts are removed from the reaction space by purging, for example with an inert gas.

Preferably, for depositing SiN films, each ALD cycle comprises at least two distinct phases. The provision and removal of a reactant from the reaction space may be considered a phase. In a first phase, a first reactant comprising silicon is provided and forms no more than about one monolayer on the substrate surface. This reactant is also referred to herein as "the silicon precursor," "silicon-containing precursor," or "silicon reactant" and may be, for example, $H_2SiI_2$.

In a second phase, a second reactant comprising a reactive species is provided and may convert adsorbed silicon to silicon nitride. In some embodiments the second reactant comprises a nitrogen reactant. In some embodiments, the reactive species comprises an excited species. In some embodiments the second reactant comprises a species from a nitrogen containing plasma. For example, the second reactant may comprise nitrogen-containing reactants generated by plasma from one or more nitrogen precursors. In some embodiments, the second reactant comprises nitrogen radicals, nitrogen atoms and/or nitrogen plasma. The second reactant may comprise other species that are not nitrogen-containing reactants. In some embodiments, the second reactant may comprise a plasma of hydrogen, radicals of hydrogen, or atomic hydrogen in one form or another. In some embodiments, the second reactant may comprise a species from a noble gas, such as He, Ne, Ar, Kr, or Xe, preferably Ar or He, for example as radicals, in plasma form, or in elemental form. These reactive species from noble gases do not necessarily contribute material to the deposited film, but can in some circumstances contribute to film growth as well as help in the formation and ignition of plasma. In some embodiments a gas that is used to form a plasma may flow constantly throughout the deposition process but only be activated intermittently. In some embodiments, the second reactant does not comprise a species from a noble gas, such as Ar. Thus, in some embodiments the adsorbed silicon precursor is not contacted with a reactive species generated by a plasma from Ar.

Additional phases may be added and phases may be removed as desired to adjust the composition of the final film.

One or more of the reactants may be provided with the aid of a carrier gas, such as one or more noble gases. In some embodiments, the carrier gas comprises one or more of Ar and He. In some embodiments the silicon precursor and the second reactant are provided with the aid of a carrier gas.

In some embodiments, two of the phases may overlap, or be combined. For example, the silicon precursor and the second reactant may be provided simultaneously in pulses that partially or completely overlap. In addition, although referred to as the first and second phases, and the first and second reactants, the order of the phases may be varied, and an ALD cycle may begin with any one of the phases. That is, unless specified otherwise, the reactants can be provided in any order, and the process may begin with any of the reactants.

According to some embodiments, a silicon nitride thin film is deposited using a PEALD process on a substrate having three-dimensional features, such as in a FinFET application. The process may comprise the following steps:

(1) a substrate comprising a three-dimensional structure is provided in a reaction space;

(2) contacting the substrate with a silicon-containing precursor, such as $SiI_2H_2$, so that silicon-containing species are adsorbed to a surface of the substrate, including onto surfaces of the three-dimensional structure;

(3) excess silicon-containing precursor and reaction byproducts are removed from the reaction space;

(4) contacting the adsorbed silicon species with nitrogen-containing species, where the nitrogen-containing species are formed by generating a nitrogen-containing plasma using vapor phase reactants, such as $N_2$, $NH_3$, $N_2H_4$, or $N_2$ and $H_2$; and (5) removing excess nitrogen atoms, plasma, or radicals and reaction byproducts;

Steps (2) through (5) may be repeated until a silicon nitride film of a desired thickness is formed.

In some embodiments step (4) can be replaced by a step in which the nitrogen atoms, plasma or radicals are formed remotely and provided to the reaction space.

In some embodiments, the PEALD process is performed at a temperature between about 100° C. to about 650° C., about 100° C. to about 550° C., about 100° C. to about 450° C., about 200° C. to about 600° C., or at about 400° C. to about 500° C. In some embodiments the temperature is about 300° C. In some embodiments, the PEALD process is performed at a temperature of about 550° C. or about 600° C.

As discussed in more detail below, in some embodiments for depositing a SiN film, one or more PEALD deposition cycles begin with provision of the silicon precursor, followed by the second precursor. In other embodiments deposition may begin with provision of the second precursor, followed by the silicon precursor. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first PEALD cycle, in subsequent PEALD cycles the reactive species phase will effectively follow the silicon phase. In some embodiments one or more different PEALD sub-cycles are provided in the process for forming a SiN thin film.

Excess reactant and reaction byproducts, if any, are removed from the vicinity of the substrate, and in particular from the substrate surface, between reactant pulses. In some embodiments the reaction chamber is purged between reactant pulses, such as by purging with an inert gas. The flow rate and time of each reactant, is tunable, as is the removal step, allowing for control of the quality and various properties of the films.

As mentioned above, in some embodiments a gas is provided to the reaction chamber continuously during each deposition cycle, and reactive species are provided by generating a plasma in the gas, either in the reaction chamber or upstream of the reaction chamber. In some embodiments the gas comprises nitrogen. In some embodiments the gas is nitrogen. In other embodiments the gas may comprise helium, or argon. In some embodiments the gas is helium or nitrogen. The flowing gas may also serve as a purge gas for the first and/or second reactant (or reactive species). For example, flowing nitrogen may serve as a purge gas for a first silicon precursor and also serve as a second reactant (as a source of reactive species). In some embodiments, nitrogen, argon, or helium may serve as a purge gas for a first precursor and a source of excited species for converting the silicon precursor to the silicon nitride film. In some embodiments the gas in which the plasma is generated does not comprise argon and the adsorbed silicon precursor is not contacted with a reactive species generated by a plasma from Ar.

The PEALD deposition cycle is repeated until a SiN film of the desired thickness and composition is obtained. In some embodiments the deposition parameters, such as the flow rate, flow time, purge time, and/or reactants themselves, may be varied in one or more deposition sub-cycles in order to obtain a film with the desired characteristics. In some embodiments, hydrogen and/or hydrogen plasma are not provided in a deposition sub-cycle, or in the deposition process.

The term "pulse" may be understood to comprise feeding reactant into the reaction chamber for a predetermined amount of time. The term "pulse" does not restrict the length or duration of the pulse and a pulse can be any length of time.

In some embodiments, the silicon reactant is provided first. After an initial surface termination, if necessary or desired, a first silicon reactant pulse is supplied to the workpiece. In accordance with some embodiments, the first reactant pulse comprises a carrier gas flow and a volatile silicon species, such as $H_2SiI_2$, that is reactive with the workpiece surfaces of interest. Accordingly, the silicon reactant adsorbs upon these workpiece surfaces. The first reactant pulse self-saturates the workpiece surfaces such that any excess constituents of the first reactant pulse do not further react with the molecular layer formed by this process.

The first silicon reactant pulse is preferably supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon reactant pulse is from about 0.05 seconds to about 5.0 seconds, about 0.1 seconds to about 3 seconds or about 0.2 seconds to about 1.0 seconds. The optimum pulsing time can be readily determined by the skilled artisan based on the particular circumstances.

After sufficient time for a molecular layer to adsorb on the substrate surface, excess first silicon reactant is then removed from the reaction space. In some embodiments the excess first reactant is purged by stopping the flow of the first chemistry while continuing to flow a carrier gas or purge gas for a sufficient time to diffuse or purge excess reactants and reactant by-products, if any, from the reaction space. In some embodiments the excess first precursor is purged with the aid of inert gas, such as nitrogen or argon, that is flowing throughout the sub-cycle.

In some embodiments, the first reactant is purged for about 0.1 seconds to about 10 seconds, about 0.3 seconds to about 5 seconds or about 0.3 seconds to about 1 second. Provision and removal of the silicon reactant can be considered the first or silicon phase of a PEALD process.

In the second phase, a second reactant comprising a reactive species, such as nitrogen plasma is provided to the workpiece. Nitrogen, $N_2$, is flowed continuously to the reaction chamber during each ALD cycle in some embodiments. Nitrogen plasma may be formed by generating a plasma in nitrogen in the reaction chamber or upstream of the reaction chamber, for example by flowing the nitrogen through a remote plasma generator.

In some embodiments, plasma is generated in flowing $H_2$ and $N_2$ gases. In some embodiments the $H_2$ and $N_2$ are provided to the reaction chamber before the plasma is ignited or nitrogen and hydrogen atoms or radicals are formed. Without being bound to any theory, it is believed that the hydrogen may have a beneficial effect on the ligand removal step i.e. it may remove some of the remaining ligands or have other beneficial effects on the film quality. In some embodiments the $H_2$ and $N_2$ are provided to the reaction chamber continuously and nitrogen and hydrogen containing plasma, atoms or radicals is created or supplied when needed.

In some embodiments, the nitrogen-containing plasma does not or substantially does not comprise hydrogen-containing species. For example, the nitrogen-containing plasma is generated using gas free or substantially free of hydrogen-containing species. In some embodiments the entire SiN deposition is done is hydrogen free. However, in some embodiments a plasma comprising H-species can be used during a high pressure step.

Typically, the second reactant, for example comprising nitrogen plasma, is provided for about 0.1 seconds to about 10 seconds. In some embodiments the second reactant, such as nitrogen plasma, is provided for about 0.1 seconds to about 10 seconds, 0.5 seconds to about 5 seconds or 0.5 seconds to about 2.0 seconds. However, depending on the reactor type, substrate type and its surface area, the second reactant pulsing time may be even higher than about 10 seconds. In some embodiments, pulsing times can be on the order of minutes. The optimum pulsing time can be readily determined by the skilled artisan based on the particular circumstances.

In some embodiments the second reactant is provided in two or more distinct pulses, without introducing another reactant in between any of the two or more pulses. For example, in some embodiments a nitrogen plasma is provided in two or more, preferably in two, sequential pulses, without introducing a Si-precursor in between the sequential pulses. In some embodiments during provision of nitrogen plasma two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the Si-precursor or a purge step. Additional pulses of plasma can be introduced in the same way. In some embodiments a plasma is ignited for an equivalent period of time in each of the pulses.

Nitrogen plasma may be generated by applying RF power of from about 10 W to about 2000 W, preferably from about 50 W to about 1000 W, more preferably from about 500 W to about 1000 W in some embodiments. In some embodiments the RF power density may be from about 0.02 W/cm$^2$ to about 2.0 W/cm$^2$, preferably from about 0.05 W/cm$^2$ to about 1.5 W/cm$^2$. The RF power may be applied to nitrogen that flows during the nitrogen plasma pulse time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the gap between the susceptor and showerhead plate is from about 0.1 cm to about 20 cm, from about 0.5 cm to about 5 cm, or from about 0.8 cm to about 3.0 cm.

After a time period sufficient to completely saturate and react the previously adsorbed molecular layer with the nitrogen plasma pulse, any excess reactant and reaction byproducts are removed from the reaction space. As with the removal of the first reactant, this step may comprise stopping the generation of reactive species and continuing to flow the inert gas, such as nitrogen or argon for a time period sufficient for excess reactive species and volatile reaction by-products to diffuse out of and be purged from the reaction space. In other embodiments a separate purge gas may be used. The purge may, in some embodiments, be from about 0.1 seconds to about 10 seconds, about 0.1 seconds to about 4 seconds or about 0.1 seconds to about 0.5 seconds. Together, the nitrogen plasma provision and removal represent a second, reactive species phase in a silicon nitride atomic layer deposition cycle.

According to some embodiments of the present disclosure, PEALD reactions may be performed at temperatures as discussed above, for example, ranging from about 25° C. to about 700° C., from about 50° C. to about 600° C., from about 100° C. to about 600° C., from about 200° C. to about 600° C., from about 100° C. to about 450° C., or from about 200° C. to about 400° C. In some embodiments the temperature may be about 300 c, about 550° C. or about 400 to about 500° C. In some embodiments, the optimum reactor temperature may be limited by the maximum allowed thermal budget. Therefore, in some embodiments the reaction temperature is from about 300° C. to about 400° C. In some applications, the maximum temperature is about 400° C., and, therefore the PEALD process is run at that reaction temperature.

In some embodiments, the exposed surfaces of the workpiece can be pretreated to provide reactive sites to react with the first phase of the PEALD sub-cycle. In some embodiments a separate pretreatment step is not performed. In some embodiments the substrate is pretreated to provide a desired surface termination. In some embodiments the substrate is pretreated with plasma.

In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer PEALD reactor is used. In other embodiments a batch reactor comprising multiple substrates is used. For embodiments in which batch PEALD reactors are used, the number of substrates is preferably in the range of 10 to 200, more preferably in the range of 50 to 150, and most preferably in the range of 100 to 130.

Exemplary single wafer reactors, designed specifically to enhance PEALD processes, are commercially available from ASM America, Inc. (Phoenix, Ariz.) under the tradenames Pulsar® 2000 and Pulsar® 3000 and ASM Japan K.K (Tokyo, Japan) under the tradename Eagle® XP, XP8 and Dragon®. Exemplary batch PEALD reactors, designed specifically to enhance PEALD processes, are commercially available from and ASM Europe B.V (Almere, Netherlands) under the tradenames A400™ and A412™.

High-Pressure Treatment Sub-Cycle

As described herein, according to some embodiments, a process for forming SiN thin films can include one or more super-cycles comprising one or more SiN deposition cycles carried out at conventional pressure and one or more high-pressure treatment sub-cycles. As used herein, a high-pressure treatment sub-cycle refers to a treatment sub-cycle comprising a process pressure of at least about 6 Torr for at least a portion of the sub-cycle, including at least about 7 Torr, at least about 20 Torr, about 30 Torr, about 40 Torr, or about 50 Torr. In some embodiments, the high-pressure treatment sub-cycle comprises a plasma step performed at a process pressure of at least about 20 Torr. For example, a pressure within the reaction chamber to which the substrate is exposed during the plasma step may be at least about 20 Torr for at least a portion of plasma step, including at least about 30 Torr, about 40 Torr, or about 50 Torr. In some embodiments, the pressure within the reaction chamber to which the substrate is exposed during the plasma step may be up to about 50 Torr, up to about 100 Torr or up to about 500 Torr. For example, the pressure within the reaction chamber can be about 6 Torr to about 50 Torr, 20 Torr to about 50 Torr, 6 Torr to about 500 Torr, or about 20 Torr to about 500 Torr for the entire or substantially entire plasma step. In some embodiments, a process pressure of a plasma step in the high-pressure treatment sub-cycle can be about 30 Torr to about 500 Torr, about 40 Torr to about 500 Torr, about 50 Torr to about 500 Torr, about 6 Torr to about 100 Torr, about 20 Torr to about 100 Torr, about 30 Torr to about 100 Torr, about 20 Torr to about 50 Torr, or about 20 Torr to about 30 Torr.

In some embodiments, the one or more plasma steps in a high-pressure treatment sub-cycle can be free or substantially free of hydrogen ions (e.g., $H^+$ and/or $H^{3+}$ ions). For example, no or substantially no hydrogen-containing gas (e.g., hydrogen ($H_2$) gas) is flowed to the reaction chamber during the one or more plasma steps. A high-pressure treatment sub-cycle comprising plasma steps free or substantially free of energetic hydrogen ions may advantageously reduce or prevent delamination of deposited silicon nitride from the substrate. In some embodiments, no or substantially no hydrogen-containing gas is flowed to the reaction chamber throughout the high-pressure treatment sub-cycle.

In some alternative embodiments, the one or more plasma steps in a high-pressure treatment sub-cycle can include hydrogen-containing species. For example, one or more plasma steps can include a plasma generated from hydrogen-containing components.

In some embodiments, a plasma power for a plasma step in a high-pressure treatment sub-cycle can be about 100 Watts (W) to about 1,500 W, preferably from about 200 W to about 1,000 W, more preferably from about 500 W to about 1,000 W. For example, a high-pressure treatment process may have a plasma power of about 800 W.

In some embodiments, a PEALD process for depositing SiN can be performed using plasma generated by capacitively coupled parallel plates, which can generate anisotropic ion bombardment upon the substrate, for example providing a film having non-uniform characteristics on horizontal and vertical surfaces. For example, the film thicknesses and film quality on substrate top surfaces and sidewall surfaces may be significantly different. The unevenness of the film thicknesses and film quality may be further enhanced upon formation of re-entrant profile on three-dimensional features of the substrate during deposition of the SiN, the re-entrant profile shadowing a sidewall portion (e.g., a sidewall portion of a trench structure) from ion bombardment. In some embodiments, performing one or more of the high-pressure treatment sub-cycle after one or more silicon nitride deposition sub-cycles can provide SiN thin films having desired uniformity in film characteristics of film formed on vertical and horizontal surfaces.

FIGS. 3A and 3B illustrate schematically examples of ion incident angles demonstrated by ions generated in a lower pressure plasma as compared to ions generated by a higher pressure plasma. As used herein, ion incident angle values, $\theta_1$ and $\theta_2$, are full width at half maximum (FWHM) values of the ion incident angle distribution. As described herein, a process pressure of the higher pressure plasma step can be greater than about 6 Torr, for example about 6 Torr to about 50 Torr, about 20 Torr to about 50 Torr, about 6 Torr to about 500 Torr, or about 20 Torr to about 500 Torr, including about 30 Torr to about 100 Torr. In some embodiments, a process pressure of the lower pressure plasma step can be less than 6 Torr, for example from about 0.1 Torr to about 5 Torr. FIG. 3A shows an example ion incident angle $\theta_1$ of an ion generated in a lower pressure plasma and FIG. 3B shows an example ion incident angle $\theta_2$ of an ion generated in a higher pressure plasma. Ion incident angle $\theta_2$ can be greater than ion incident angle $\theta_1$. For example, a higher pressure plasma may generate a greater number of ion collisions in a plasma sheath region over the substrate, providing increased ion incident angle upon vertical surfaces of the substrate.

In some embodiments, the conditions of plasma step are selected to provide an ion incident angle values of more than about 20°, including more than about 50°, or more than about 75°. In some embodiments, such incident angle values are achieved in three-dimensional structures having aspect ratios of greater than about 2, aspect ratios greater than about 3, aspect ratios greater than about 5, and in some embodiments in aspect ratios of greater than about 8.

A plasma step performed in an elevated pressure regime may advantageously facilitate formation of a conformal SiN thin film having desired uniformity in characteristics between the film formed on horizontal surfaces of the three-dimensional structure (e.g., a top surface) and film formed on vertical surfaces of the three-dimensional structure. In some embodiments, increased ion incident angles can advantageously provide improved uniformity in the wet etch rates and/or film thicknesses of SiN film formed on horizontal surfaces and vertical surfaces of a three-dimensional structure. In some embodiments, increased ion incident angles can advantageously provide SiN thin films having desired uniformity in film density and/or impurity levels between film formed on horizontal and vertical surfaces.

In some embodiments, a high-pressure treatment sub-cycle can include one or more steps during which the substrate is not exposed to a plasma, such as one or more steps in which the substrate is transported to a space free or substantially free of plasma radicals, and/or one or more purge steps. In some embodiments, a purge step can precede a plasma step in a high-pressure treatment sub-cycle. In some embodiments, a purge step can follow a plasma step in a high-pressure treatment sub-cycle. In some embodiments, a plasma step in a high-pressure treatment sub-cycle is both preceded and followed by a purge step. For example, a high-pressure treatment sub-cycle may include a first purge step, followed by a plasma step, and then a second purge step following the plasma step.

In some embodiments, a purge gas for the purge step comprises the carrier gas. In some embodiments, a purge gas for the purge step comprises the nitrogen-containing gas used in a plasma step of the high-pressure treatment sub-cycle. In some embodiments, the carrier gas and the nitrogen-containing gas can be continuously flowed throughout the high-pressure treatment sub-cycle. For example, the flow of the carrier gas and nitrogen-containing gas can be initiated for a first purge step. The flow of the carrier gas and nitrogen-containing gas may be maintained or substantially maintained during a subsequent plasma step, and the plasma power is turned on. The plasma power may be turned off after a desired duration, and the flow of the carrier gas and nitrogen-containing gas can be maintained after the plasma power is turned off and during the second purge step following the plasma step.

In some embodiments, a process pressure of the high-pressure treatment sub-cycle may be increased during a purge step prior to a plasma step and decreased in a purge step following the plasma step. For example, a pressure of the reaction chamber may be ramped up during the purge step to a desired pressure of the subsequent plasma step such that the plasma step begins at the desired process pressure. The desired process pressure is maintained or substantially maintained during the plasma step. The reaction chamber pressure may then be ramped down to a lower pressure during the purge step following the plasma step. In some embodiments, the process pressure of the high-pressure treatment sub-cycle can be maintained at a desired process pressure for a plasma step of the sub-cycle.

In some embodiments, a purge step following a plasma step can include flow of one or more gases used in a first step of a subsequent silicon nitride deposition sub-cycle. For example, a purge step performed after a plasma step of a high pressure treatment sub-cycle and before a silicon nitride deposition sub-cycle can include flow of one or more gasses used a first step of the subsequent silicon nitride deposition sub-cycle. In some embodiments, the purge step can include flow of hydrogen gas ($H_2$). For example, the purge step can include flow of hydrogen gas ($H_2$) at a rate used for the subsequent silicon nitride deposition sub-cycle step such that the flow of the hydrogen gas ($H_2$) is maintained or substantially maintained at that rate for the first step of the silicon nitride deposition sub-cycle. For example, the purge step can include flow of the carrier gas and nitrogen-containing gas (e.g., $N_2$ gas), as well as hydrogen gas ($H_2$).

Figure 4A:
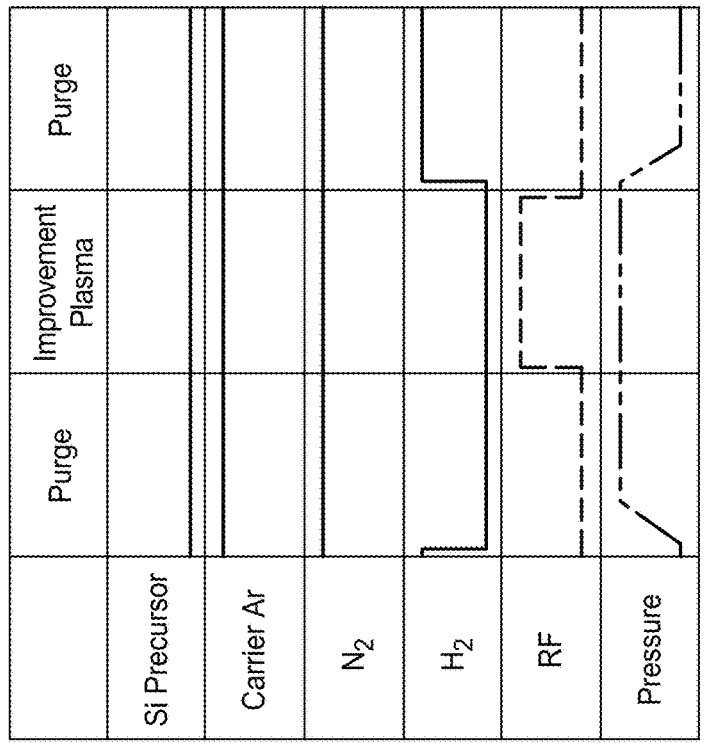
FIGS. 4A and 4B are examples of timing diagrams for a silicon nitride deposition process, according to some embodiments, comprising a silicon nitride deposition sub-cycle and a high-pressure treatment sub-cycle, respectively.
Figure 4B:
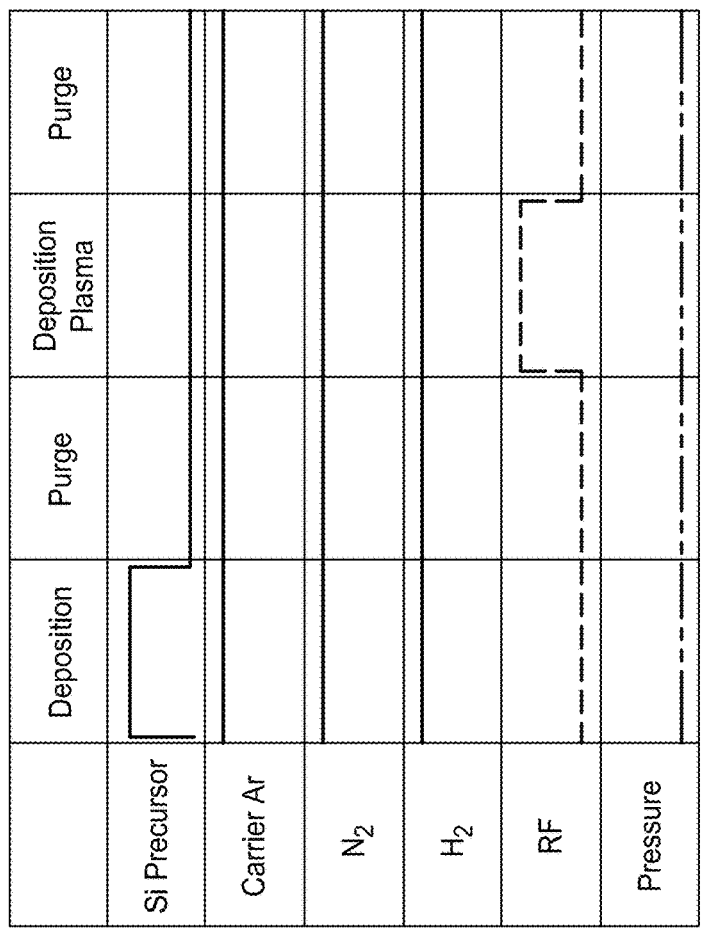

FIGS. 4A and 4B show examples of timing diagrams of various process parameters for a silicon nitride deposition sub-cycle and a high-pressure treatment sub-cycle. In the silicon nitride deposition sub-cycle shown in FIG. 4A, the silicon nitride deposition sub-cycle can comprise a PEALD type process. For example, the silicon nitride deposition sub-cycle may comprise a silicon precursor step (e.g., flow of one or more silicon precursors to the reaction chamber), followed by a purge step, then a plasma step comprising flow of nitrogen gas ($N_2$) and hydrogen gas ($H_2$), and another purge step. The silicon nitride deposition sub-cycle may comprise alternating and sequentially contacting the substrate with the one or more silicon precursors (e.g., by pulsing of the one or more silicon precursors) and the one or more nitrogen reactants (e.g., by application of the plasma step). Flow of a carrier gas and one or more gasses used for the plasma step (e.g., nitrogen gas ($N_2$) and hydrogen gas ($H_2$)) can be continued for the duration of the sub-cycle. As described herein, the silicon nitride deposition sub-cycle can be performed at a process pressure significantly lower than that used in a high-pressure treatment process.

As shown in FIG. 4A, the silicon precursor step can include starting and then stopping flow of the one or more silicon precursors (e.g., pulsing the one or more silicon precursors). The silicon precursor step may also include flow of a carrier gas, for example to facilitate delivery of the one or more silicon precursors to the substrate. In some embodiments, the carrier gas is Ar or comprises Ar. The silicon precursor step may comprise flow of nitrogen gas ($N_2$) and hydrogen gas ($H_2$). In some embodiments, nitrogen gas ($N_2$) and hydrogen gas ($H_2$) can be flowed continuously or substantially continuously throughout the silicon nitride deposition sub-cycle.

The silicon precursor step may be followed by a first purge step to remove excess silicon precursors from the vicinity of the substrate. The first purge step may comprise flow of the carrier gas and the nitrogen gas ($N_2$) and hydrogen gas ($H_2$). As show in FIG. 4A, the silicon precursor is not flowed during the purge step, while flow of the carrier gas, the nitrogen gas ($N_2$) and hydrogen gas ($H_2$) can be continued. For example, flow of the carrier gas and the nitrogen gas ($N_2$) and hydrogen gas ($H_2$) can be maintained or substantially maintained throughout the first purge step at a rate flowed used in the silicon precursor step.

The first purge step can be followed by the plasma step. As shown in FIG. 4A, the carrier gas may be flowed during the plasma step, for example to facilitate delivery of the one or more nitrogen reactants to the substrate such that the nitrogen reactants can react with the adsorbed silicon precursors. The plasma step can include turning on and then turning off the plasma while flowing the carrier gas, and the nitrogen gas ($N_2$) and hydrogen gas ($H_2$) gas. For example, after a first purge step has been performed, the plasma step may include striking the plasma while maintaining or substantially maintaining the flow of the carrier gas and the nitrogen gas ($N_2$) and hydrogen gas ($H_2$) at a rate used during the first purge step. The plasma step can be configured to generate a plasma comprising N*, H*, NH* and/or $NH_2$* radicals.

The plasma power may be turned off after desired plasma has been provided and a second purge step can follow. As shown in the example of FIG. 4A, flow of the carrier gas and the nitrogen gas ($N_2$) and hydrogen gas ($H_2$) can be continued during the second purge step to remove excess reactants and/or reaction byproducts. For example, flow of the carrier gas and the nitrogen gas ($N_2$) and hydrogen gas ($H_2$) may be maintained during the second purge step at a rate used in the plasma step. In some embodiments, flow of the carrier gas and the nitrogen gas ($N_2$) and hydrogen gas ($H_2$) can be maintained or substantially maintained a same rate throughout the silicon nitride deposition sub-cycle.

FIG. 4B shows an example of a timing diagram of various process parameters for a high-pressure treatment sub-cycle. As shown in FIG. 4B, silicon precursors are not provided during the high-pressure treatment sub-cycle. According to the example shown in FIG. 4B, the high-pressure treatment sub-cycle may comprise a first purge step, followed by a plasma step, and then a second purge step. The first purge step may comprise flow of a carrier gas and nitrogen gas ($N_2$). Any flow of hydrogen gas ($H_2$) can be turned off during the first purge step, for example if hydrogen gas ($H_2$) was flowed for a step in an immediately preceding silicon nitride deposition sub-cycle, such that a high-pressure treatment sub-cycle free or substantially free of hydrogen ions (e.g., $H^+$ and/or $H^{3+}$ ions) can be provided. Process pressure may be increased during the first purge step. For example, the process pressure may be ramped from an initial lower pressure (e.g., a pressure of an immediately preceding silicon nitride deposition sub-cycle or an immediately preceding high pressure treatment sub-cycle) to a desired pressure of the subsequent plasma step.

The first purge step in the high pressure treatment sub-cycle can be followed by the plasma step. Flow of the nitrogen gas ($N_2$) and the carrier gas can be continued during the plasma step. For example, in the plasma step, plasma power is provided while nitrogen gas ($N_2$) and the carrier gas are flowed, such as at a rate flowed during the first purge step. The nitrogen gas ($N_2$) can be used to generate a plasma comprising non-reactive ions. The plasma may be turned off after desired exposure of the substrate to the plasma, and the second purge step can be performed.

Flow of the nitrogen gas ($N_2$) and the carrier gas can be continued during the second purge step. For example, flow of the nitrogen gas ($N_2$) and the carrier gas can be maintained at a rate used in the plasma step. In some embodiments, flow of the nitrogen gas ($N_2$) and the carrier gas can be maintained or substantially maintained a same rate throughout the high-pressure treatment sub-cycle. The process pressure may be decreased during the second purge step. For example, a pressure within the reaction chamber to which the substrate is exposed may be ramped down during the second purge step from the process pressure of the plasma step to a lower pressure.

In some embodiments, as shown in FIG. 4B, hydrogen gas ($H_2$) may be turned on during the second purge step. For example, the hydrogen gas ($H_2$) may be turned on if the high-pressure treatment sub-cycle is immediately followed by a silicon nitride deposition sub-cycle comprising flow of hydrogen gas ($H_2$).

In some embodiments, a process for forming a SiN thin film may comprise a plurality of super cycles, each super-cycle comprising a number of repetitions of the silicon nitride deposition sub-cycle of FIG. 4A followed by a number of repetitions of the high-pressure treatment sub-cycle of FIG. 4B. The number of super-cycles, silicon nitride deposition sub-cycles, and/or high-pressure treatment sub-cycles can be selected to form a SiN thin film having one or more desired characteristics as described herein.

Si Precursors

In some embodiments, the Si precursor for depositing SiN thin film comprises a silyl halide. In some embodiments, the Si precursor comprises iodine. In certain embodiments, the Si precursor is $H_2SiI_2$.

Examples of silicon precursors for depositing SiN are provided in U.S. patent application Ser. No. 14/167,904, filed Jan. 29, 2014, entitled "Si PRECURSORS FOR DEPOSITION OF SiN AT LOW TEMPERATURES," which is incorporated herein by reference in its entirety.

In some embodiments, the Si-precursor comprises iodine and one or more ligands such as one or more organic ligands. In some embodiment, the Si-precursor may comprise iodine and one or more alkyl groups, such as a methyl group, ethyl group, propyl group, and/or hydrogen. In some embodiments, the Si-precursor comprises iodine and one or more other halides, such as bromine or chlorine.

In some embodiments, a silicon precursor comprises three iodines and one amine or alkylamine ligands bonded to silicon. In some embodiments silicon precursor comprises one or more of the following: $(SiI_3)NH_2$, $(SiI_3)NHMe$, $(SiI_3)NHEt$, $(SiI_3)NH^iPr$, $(SiI_3)NH^tBu$, $(SiI_3)NMe_2$, $(SiI_3)NMeEt$, $(SiI_3)NMe^iPr$, $(SiI_3)NMe^tBu$, $(SiI_3)NEt_2$, $(SiI_3)NEt^iPr$, $(SiI_3)NEt^tBu$, $(SiI_3)N^iPr_2$, $(SiI_3)N^iPr^tBu$, and $(SiI_3)N^tBu_2$. In some embodiments, a silicon precursor comprises two, three, four, five, six, seven, eight, nine, ten, eleven, twelve, thirteen, fourteen, fifteen or more compounds selected from $(SiI_3)NH_2$, $(SiI_3)NHMe$, $(SiI_3)NHEt$, $(SiI_3)$ NH$^i$Pr, (SiI$_3$)NH$^t$Bu, (SiI$_3$)NMe$_2$, (SiI$_3$)NMeEt, (SiI$_3$) NMe$^i$Pr, (SiI$_3$)NMe$^t$Bu, (SiI$_3$)NEt$_2$, (SiI$_3$)NEt$^i$Pr, (SiI$_3$) NEt$^t$Bu, (SiI$_3$)N$^i$Pr$_2$, (SiI$_3$)N$^i$Pr$^t$Bu, (SiI$_3$)N$^t$Bu$_2$, and combinations thereof. In some embodiments, a silicon precursor comprises two iodines and two amine or alkylamine ligands bonded to silicon. In some embodiments, silicon precursor comprises one or more of the following: (SiI$_2$)(NH$_2$)$_2$, (SiI$_2$)(NHMe)$_2$, (SiI$_2$)(NHEt)$_2$, (SiI$_2$)(NH$^i$Pr)$_2$, (SiI$_2$) (NH$^t$Bu)$_2$, (SiI$_2$)(NMe$_2$)$_2$, (SiI$_2$)(NMeEt)$_2$, (SiI$_2$)(NMe$^i$Pr)$_2$, (SiI$_2$)(NMe$^t$Bu)$_2$, (SiI$_2$)(NEt$_2$)$_2$, (SiI$_2$)(NEt$^i$Pr)$_2$, (SiI$_2$) (NEt$^t$Bu)$_2$, (SiI$_2$)(N$^i$Pr$_2$)$_2$, (SiI$_2$)(N$^i$Pr$^t$Bu)$_2$, and (SiI$_2$) (N$^t$Bu)$_2$. In some embodiments, a silicon precursor comprises two, three, four, five, six, seven, eight, nine, ten, eleven, twelve, thirteen, fourteen, fifteen or more compounds selected from (SiI$_2$)(NH$_2$)$_2$, (SiI$_2$)(NHMe)$_2$, (SiI$_2$) (NHEt)$_2$, (SiI$_2$)(NH$^i$Pr)$_2$, (SiI$_2$)(NH$^t$Bu)$_2$, (SiI$_2$)(NMe$_2$)$_2$, (SiI$_2$)(NMeEt)$_2$, (SiI$_2$)(NMe$^i$Pr)$_2$, (SiI$_2$)(NMe$^t$Bu)$_2$, (SiI$_2$) (NEt$_2$)$_2$, (SiI$_2$)(NEt$^i$Pr)$_2$, (SiI$_2$)(NEt$^t$Bu)$_2$, (SiI$_2$)(N$^i$Pr$_2$)$_2$, (SiI$_2$)(N$^i$Pr$^t$Bu)$_2$, (SiI$_2$)(N$^t$Bu)$_2$, and combinations thereof.

In certain embodiments, a silicon precursor comprises two iodines, hydrogen and one amine or alkylamine ligand or two iodines and two alkylamine ligands bonded to silicon and wherein amine or alkylamine ligands are selected from amine NH$_2$—, methylamine MeNH—, dimethylamine Me$_2$N—, ethylmethylamine EtMeN—, ethylamine EtNH—, and diethylamine Et$_2$N—. In some embodiments silicon precursor comprises one or more of the following: (SiI$_2$H) NH$_2$, (SiI$_2$H)NHMe, (SiI$_2$H)NHEt, (SiI$_2$H)NMe$_2$, (SiI$_2$H) NMeEt, (SiI$_2$H)NEt$_2$, (SiI$_2$)(NH$_2$)$_2$, (SiI$_2$)(NHMe)$_2$, (SiI$_2$) (NHEt)$_2$, (SiI$_2$)(NMe$_2$)$_2$, (SiI$_2$)(NMeEt)$_2$, and (SiI$_2$)(NEt$_2$)$_2$. In some embodiments a silicon precursor comprises two, three, four, five, six, seven, eight, nine, ten, eleven, twelve or more compounds selected from (SiI$_2$H)NH$_2$, (SiI$_2$H) NHMe, (SiI$_2$H)NHEt, (SiI$_2$H)NMe$_2$, (SiI$_2$H)NMeEt, (SiI$_2$H)NEt$_2$, (SiI$_2$)(NH$_2$)$_2$, (SiI$_2$)(NHMe)$_2$, (SiI$_2$)(NHEt)$_2$, (SiI$_2$)(NMe$_2$)$_2$, (SiI$_2$)(NMeEt)$_2$, (SiI$_2$)(NEt$_2$)$_2$, and combinations thereof.

In some embodiments, a silicon precursor comprises one or more of the following: SiI$_4$, HSiI$_3$, H$_2$SiI$_2$, H$_3$SiI, Si$_2$I$_6$, HSi$_2$I$_5$, H$_2$Si$_2$I$_4$, H$_3$Si$_2$I$_3$, H$_4$Si$_2$I$_2$, H5Si2I, Si3I8, HSi2I5, H2Si2I4, H3Si2I3, H4Si2I2, H5Si2I, MeSiI3, Me2SiI2, Me3SiI, MeSi2I5, Me2Si2I4, Me3Si2I3, Me4Si2I2, Me5Si2I, HMeSiI2, H2MeSiI, HiMeSi2I4, HiMe2Si2I3, HiMe3Si2I2, HiMe4Si2I, H2MeSiI, H2MeSi2I3, H2Me2Si2I2, H2Me3Si2I, H3MeSi2I2, H3Me2Si2I, H4MeSi2I, EtSiI3, Et2SiI2, Et3SiI, EtSi2I5, Et2Si2I4, Et3Si2I3, Et4Si2I2, Et5Si2I, HEtSiI2, HEt2SiI, HEtSi2I4, HEt2Si2I3, HEt3Si2I2, HEt4Si2I, H2EtSiI, H2EtSi2I3, H2Et2Si2I2, H2Et3Si2I, H3EtSi2I2, H3Et2Si2I, and H4EtSi2I.

In some embodiments, a silicon precursor comprises one or more of the following: EtMeSiI2, Et2MeSiI, EtMe2SiI, EtMeSi2I4, Et2MeSi2I3, EtMe2Si2I3, Et3MeSi2I2, Et2Me2Si2I2, EtMe3Si2I2, Et4MeSi2I, Et3Me2Si2I, Et2Me3Si2I, EtMe4Si2I, HEtMeSiI, HEtMeSi2I3, HEt2MeSi2I2, HEtMe2Si2I2, HEt3MeSi2I, HEt2Me2Si2I, HEtMe3Si2I, H2EtMeSi2I2, H2Et2MeSi2I, H2EtMe2Si2I, H3EtMeSi2I.

In some embodiments, a silicon precursor comprises one iodine, one hydrogen and two amine or alkylamine ligand bonded to silicon. In some embodiments, silicon precursor comprises one or more of the following: (SiIH)(NH2)2, (SiIH)(NHMe)2, (SiIH)(NHEt)2, (SiIH)(NHiPr)2, (SiIH)(NHtBu)2, (SiIH)(NMe2)2, (SiIH)(NMeEt)2, (SiIH)(NMeiPr)2, (SiIH)(NMetBu)2, (SiIH)(NEt2)2, (SiIH)(NEtiPr)2, (SiIH)(NEttBu)2, (SiIH)(NiPr2)2, (SiIH)(NiPrtBu)2, and (SiIH)(NtBu)2. In some embodiments, a silicon precursor comprises two, three, four, five, six, seven, eight, nine, ten, eleven, twelve, thirteen, fourteen, fifteen or more compounds selected from (SiIH)(NH2)2, (SiIH)(NHMe)2, (SiIH)(NHEt)2, (SiIH)(NHiPr)2, (SiIH)(NHtMe)2, (SiIH)(NHEt)2, (SiIH)(NHiPr)2, (SiIH)(NMe2)2, (SiIH)(NMeEt)2, (SiIH)(NMeiPr)2, (SiIH)(NMetBu)2, (SiIH)(NEt2)2, (SiIH)(NEtiPr)2, (SiIH)(NEttBu)2, (SiIH)(NiPr2)2, (SiIH)(NiPrtBu)2, and (SiIH)(NtBu)2, and combinations thereof.

In some embodiments, a silicon precursor comprises one iodine, two hydrogens and one amine or alkylamine ligand bonded to silicon. In some embodiments silicon precursor comprises one or more of the following: (SiIH2)NH2, (SiIH2)NHMe, (SiIH2)NHEt, (SiIH2)NHiPr, (SiIH2)NHtBu, (SiIH2)NMe2, (SiIH2)NMeEt, (SiIH2)NMeiPr, (SiIH2)NMetBu, (SiIH2)NEt2, (SiIH2)NEtiPr, (SiIH2)NEttBu, (SiIH2)NiPr2, (SiIH2)NtPrtBu, and (SiIH2)NtBu2. In some embodiments a silicon precursor comprises two, three, four, five, six, seven, eight, nine, ten, eleven, twelve, thirteen, fourteen, fifteen or more compounds selected from (SiIH2)NH2, (SiIH2)NHMe, (SiIH2)NHEt, (SiIH2)NHiPr, (SiIH2)NHtBu, (SiIH2)NMe2, (SiIH2)NMeEt, (SiIH2)NMeiPr, (SiIH2)NMetBu, (SiIH2)NEt2, (SiIH2)NEtiPr, (SiIH2)NEttBu, (SiIH2)NiPr2, (SiIH2)NiPrtBu, (SiIH2)NtBu2, and combinations thereof.

In some embodiments, a silicon precursor comprises one iodine and three amine or alkylamine ligands bonded to silicon. In some embodiments, silicon precursor comprises one or more of the following: (SiI)(NH2)3, (SiI)(NHMe)3, (SiI)(NHEt)3, (SiI)(NHiPr)3, (SiI)(NHtBu)3, (SiI)(NMe2)3, (SiI)(NMeEt)3, (SiI)(NMeiPr)3, (SiI)(NMetBu)3, (SiI)(NEt2)3, (SiI)(NEtiPr)3, (SiI)(NEttBu)3, (SiI)(NiPr2)3, (SiI)(NiPrtBu)3, and (SiI)(NtBu)3. In some embodiments a silicon precursor comprises two, three, four, five, six, seven, eight, nine, ten, eleven, twelve, thirteen, fourteen, fifteen or more compounds selected from (SiI)(NH2)3, (SiI)(NHMe)3, (SiI)(NHEt)3, (SiI)(NHiPr)3, (SiI)(NHtBu)3, (SiI)(NMe2)3, (SiI)(NMeEt)3, (SiI)(NMeiPr)3, (SiI)(NMetBu)3, (SiI)(NEt2)3, (SiI)(NEtiPr)3, (SiI)(NEttBu)3, (SiI)(NiPr2)3, (SiI)(NiPrtBu)3, (SiI)(NtBu)3, and combinations thereof.

In certain embodiments, a silicon precursor comprises two iodines, hydrogen and one amine or alkylamine ligand or two iodines and two alkylamine ligands bonded to silicon and wherein amine or alkylamine ligands are selected from amine NH2-, methylamine MeNH—, dimethylamine Me2N—, ethylmethylamine EtMeN—, ethylamine EtNH—, and diethylamine Et2N—. In some embodiments silicon precursor comprises one or more of the following: (SiI2H)NH2, (SiI2H)NHMe, (SiI2H)NHEt, (SiI2H)NMe2, (SiI2H)NMeEt, (SiI2H)NEt2, (SiI2)(NH2)2, (SiI2)(NHMe)2, (SiI2)(NHEt)2, (SiI2)(NMe2)2, (SiI2)(NMeEt)2, and (SiI2)(NEt2)2. In some embodiments a silicon precursor comprises two, three, four, five, six, seven, eight, nine, ten, eleven, twelve or more compounds selected from (SiI2H)NH2, (SiI2H)NHMe, (SiI2H)NHEt, (SiI2H)NMe2, (SiI2H)NMeEt, (SiI2H)NEt2, (SiI2)(NH2)2, (SiI2)(NHMe)2, (SiI2)(NHEt)2, (SiI2)(NMe2)2, (SiI2)(NMeEt)2, (SiI2)(NEt2)2, and combinations thereof.

N Precursors

As discussed above, the second reactant for depositing silicon nitride according to the present disclosure may comprise a nitrogen precursor, which may comprise a reactive species. Suitable plasma compositions of a PEALD process include nitrogen plasma, radicals of nitrogen, or atomic nitrogen in one form or another. In some embodiments, hydrogen plasma, radicals of hydrogen, or atomic hydrogen in one form or another are also provided. And in some embodiments, a plasma may also contain noble gases, such as He, Ne, Ar, Kr and Xe, preferably Ar or He, in plasma form, as radicals, or in atomic form. In some embodiments, the second reactant does not comprise any species from a noble gas, such as Ar. Thus, in some embodiments plasma is not generated in a gas comprising a noble gas.

Thus, in some embodiments the second reactant may comprise plasma formed from compounds having both N and H, such as $NH_3$ and $N_2H_4$, a mixture of $N_2/H_2$ or other precursors having an N—H bond. In some embodiments the second reactant may be formed, at least in part, from $N_2$. In some embodiments the second reactant may be formed, at least in part, from $N_2$ and $H_2$, where the $N_2$ and $H_2$ are provided at a flow ratio ($N_2/H_2$) from about 20:1 to about 1:20, preferably from about 10:1 to about 1:10, more preferably from about 5:1 to about 1:5 and most preferably from about 1:2 to about 4:1, and in some cases 1:1. For example, a nitrogen-containing plasma for depositing silicon nitride can be generated using both $N_2$ and $H_2$ at one or more ratios described herein.

In some embodiments, the nitrogen plasma may be free or substantially free of hydrogen-containing species (e.g., hydrogen ions, radicals, atomic hydrogen). For example, hydrogen-containing gas is not used to generate the nitrogen plasma. In some embodiments, hydrogen-containing gas (e.g., $H_2$ gas) is not flowed into the reaction chamber during the nitrogen plasma step.

In some embodiments, a plasma power used for generating a nitrogen-containing plasma can be about 10 Watts (W) to about 2,000 W, about 50 W to about −1000 W, about 100 W to about 1000 W or about 500 W to about 1000 W. In some embodiments, a plasma power used for generating a nitrogen-containing plasma can be about 800 W to about 1,000 W.

The second reactant may be formed in some embodiments remotely via plasma discharge ("remote plasma") away from the substrate or reaction space. In some embodiments, the second reactant may be formed in the vicinity of the substrate or directly above substrate ("direct plasma").

SiN Film Characteristics

Silicon nitride thin films deposited according to some of the embodiments discussed herein may achieve impurity levels or concentrations below about 3 at-%, preferably below about 1 at-%, more preferably below about 0.5 at-%, and most preferably below about 0.1 at-%. In some thin films, the total impurity level excluding hydrogen may be below about 5 at-%, preferably below about 2 at-%, more preferably below about 1 at-%, and most preferably below about 0.2 at-%. And in some thin films, hydrogen levels may be below about 30 at-%, preferably below about 20 at-%, more preferably below about 15 at-%, and most preferably below about 10 at-%.

In some embodiments, the deposited SiN films do not comprise an appreciable amount of carbon. However, in some embodiments a SiN film comprising carbon is deposited. For example, in some embodiments an ALD reaction is carried out using a silicon precursor comprising carbon and a thin silicon nitride film comprising carbon is deposited. In some embodiments a SiN film comprising carbon is deposited using a precursor comprising an alkyl group or other carbon-containing ligand. Different alkyl groups, such as Me or Et, or other carbon-containing ligands may produce different carbon concentrations in the films because of different reaction mechanisms. Thus, different precursors can be selected to produce different carbon concentration in deposited SiN films. In some embodiments, a SiN film comprising carbon having desired dielectric constant can be deposited. In some embodiments the thin SiN film comprising carbon may be used, for example, as a low-k spacer. In some embodiments the thin films do not comprise argon.

According to some embodiments, the silicon nitride thin films may exhibit step coverage and pattern loading effects of greater than about 50%, preferably greater than about 80%, more preferably greater than about 90%, and most preferably greater than about 95%. In some cases step coverage and pattern loading effects can be greater than about 98% and in some case about 100% (within the accuracy of the measurement tool or method). These values can be achieved in features with aspect ratios of 2 or greater, in some embodiments in aspect ratios of about 3 or greater, in some embodiments in aspect ratios of about 5 or greater and in some embodiments in aspect ratios of about 8 or greater.

As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three-dimensional structure relative to the film thickness on the sidewall or bottom of the three-dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field).

In some embodiments, silicon nitride films are deposited to a thicknesses of from about 3 nm to about 50 nm, preferably from about 5 nm to about 30 nm, more preferably from about 5 nm to about 20 nm. These thicknesses can be achieved in feature sizes (width) below about 100 nm, preferably about 50 nm, more preferably below about 30 nm, most preferably below about 20 nm, and in some cases below about 15 nm. According to some embodiments, a SiN film is deposited on a three-dimensional structure and the thickness at a sidewall may be slightly even more than 10 nm.

According to some embodiments silicon nitride films with various wet etch rates (WER) may be deposited. When using a blanket WER in 0.5% dHF (nm/min), silicon nitride films may have WER values of less than about 5, preferably less than about 4, more preferably less than about 2, and most preferably less than about 1. In some embodiments it could less than about 0.3.

The blanket WER in 0.5% dHF (nm/min) relative to the WER of thermal oxide may be less than about 3, preferably less than about 2, more preferably less than about 1, and most preferably less than about 0.5.

And in some embodiments, the sidewall WER of the three dimensional feature, such as fin or trench relative to the top region WER of a three dimensional feature, such as fin or trench, in 0.5% dHF may be less than about 4, preferably less than about 3, more preferably less than about 2, most preferably about 1.

In some embodiments, SiN formed according to one or more processes described herein can advantageously demonstrate a WERR of about 1, for example in 0.5% dHF. For example, a ratio of a wet etch rate of SiN thin film formed over horizontal surfaces (e.g., top surfaces) to a wet etch rate of the SiN thin film formed over vertical surfaces (e.g., sidewall surfaces) of three-dimensional structures on a substrate surface can be the same or substantially the same. In some embodiments, the ratio can be about 0.25 to about 2, about 0.5 to about 1.5, about 0.75 to about 1.25, or about 0.9 to about 1.1. These ratios can be achieved in features with aspect ratios of about 2 or more, about 3 or more, about 5 or more or even about 8 or more.

It has been found that in using the silicon nitride thin films of the present disclosure, thickness differences between top and side may not be as critical for some applications, due to the improved film quality and etch characteristics. Nevertheless, in some embodiments, the thickness gradient along the sidewall may be very important to subsequent applications or processes.

In some embodiments, the amount of etching of silicon nitride films according to the present disclosure may be about one or two times less than amount of etching observed for thermal $SiO_2$(TOX) in a 0.5% RF-dip process (for example in a process in which about 2 to about 3 nm TOX is removed, one or two times less SiN is removed when deposited according to the methods disclosed herein). The WER of preferred silicon nitride films may be less than that of prior art thermal oxide films.

Figure 5A:
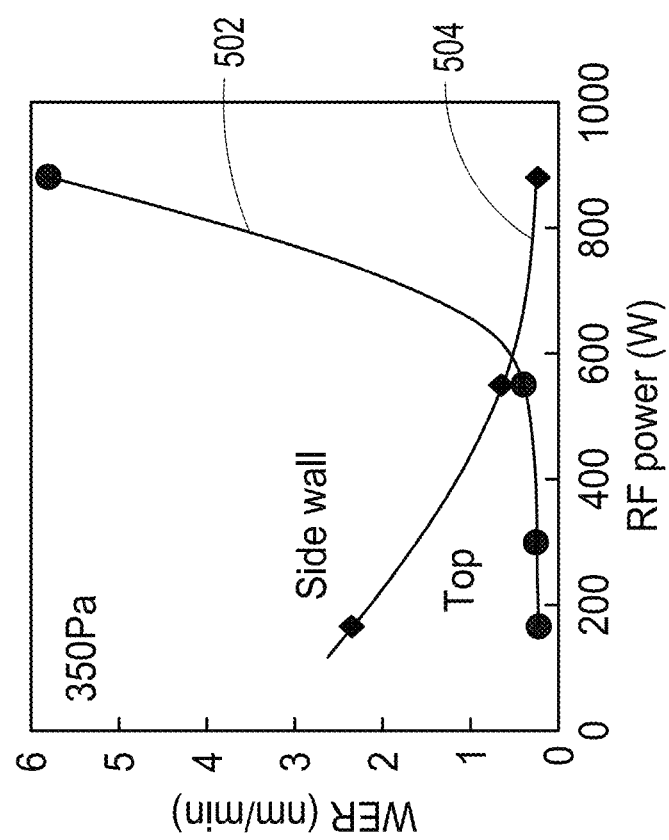
FIGS. 5A-5C show wet etch rate performance curves of a SiN film formed by a process using conventional pressure (FIG. 5A and FIG. 5B), and wet etch rate performance curves of a SiN film formed using a high-pressure treatment process according to one or more embodiments described herein (FIG. 5C).
Figure 5B:
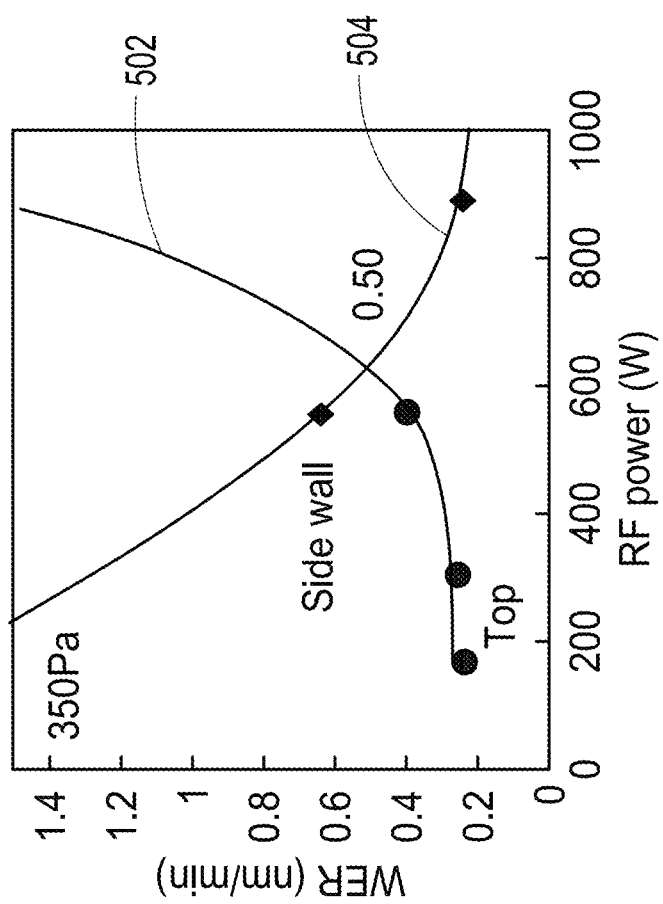
Figure 5C:
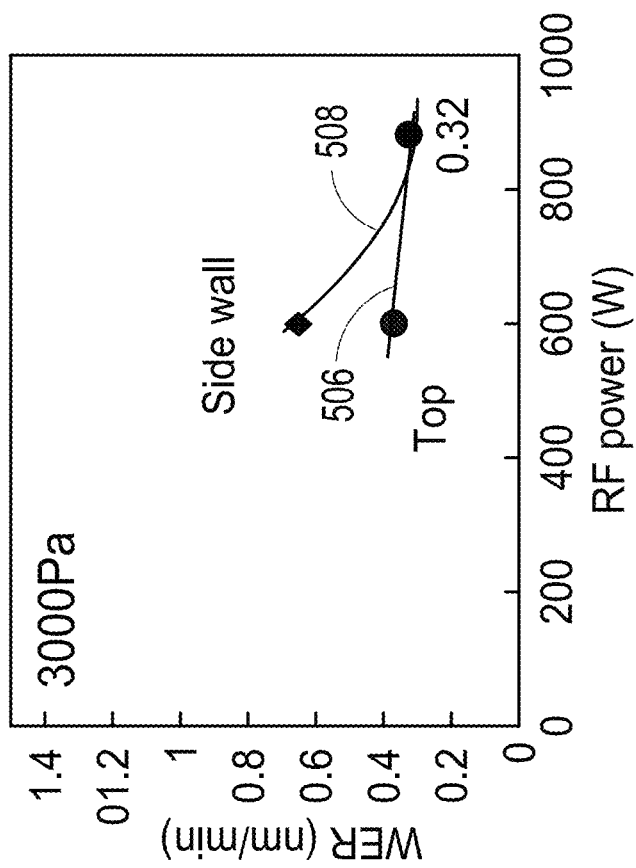

FIGS. 5A through 5C are wet etch rate (WER) curves showing example wet etch rate performances in dilute HF (0.5 weight % aqueous solution) of SiN thin films deposited over three-dimensional trench structures. The films were deposited using PEALD processes using $H_2SiI_2$ as the silicon precursor and $N_2$ and $H_2$ gases for generating the reactive nitrogen-containing species. The wet etch rate is shown on the y-axis in nanometers per minute (nm/min) and the plasma power used in the deposition of the SiN thin film is shown on the x-axis in Watts (W). The SiN films of FIGS. 5A through 5C were deposited on trench structures having an aspect ratio of about 3.

The SiN films of FIGS. 5A and 5B were deposited using a PEALD process at a process pressure of about 350 Pascals (Pa). WER curve 502 shows etch performance of the portion of the SiN film formed on top surfaces of the trench structures using the process pressure of about 350 Pa. WER curve 504 shows etch performance of the portion of the SiN film formed on sidewall surfaces of the trench structures using the process pressure of about 350 Pa. FIG. 5B shows a portion of the WER curves 502, 504 shown in FIG. 5A.

FIGS. 5A and 5B show RF power dependency of wet etch rate performance of SiN film deposited at the process pressure of about 350 Pa. For example, portions of SiN films deposited on top surfaces of the trench structures at RF powers less than about 600 W demonstrated better wet etch rate performance than that formed on sidewall surfaces of the trenches. In some embodiments, such a difference in wet etch rate performance may be due to less ion bombardment on the side wall surfaces of the trenches than on the top surfaces. In SiN films deposited using the process pressure of about 350 Pa, wet etch rate of the portions of the films formed on sidewall surfaces improved with increased RF power in the deposition process, while that of the portions of the films formed on top surfaces deteriorated. In some embodiments, such an improvement in wet etch rate of film formed on sidewall surfaces may be due, at least in part, to increased density of ion species in higher RF power processes. In some embodiments, the deterioration of wet etch rate of film formed on top surfaces may be due, at least in part, degradation of film quality on the top surfaces at higher RF powers, for example due to over exposure of the top surfaces to ion bombardment.

The SiN films of FIG. 5C were deposited using a PEALD process performed at a process pressure of about 3000 Pascals (Pa). WER curve 506 shows etch performance of the portions of the SiN films formed on top surfaces of the trench structures using the process pressure of about 3000 Pa. WER curve 508 shows etch performance of the portions of the SiN films formed on sidewall surfaces of the trench structures using the process pressure of about 3000 Pa.

As shown in FIG. 5C, higher RF power used in the higher pressure PEALD process improved the wet etch rate performance of SiN film formed on side wall surfaces, while desired wet etch rate performance of SiN film formed on top surfaces of the trenches was maintained. In some embodiments, the higher pressure process may reduce effects on film quality due to anisotropy of ion bombardment by increasing collision of plasma species. As shown in FIG. 5C, using a higher pressure process may provide desired film wet etch rate performances of film formed both on top and side wall surfaces. For example, wet etch rate of SiN film portions formed on top and side wall surfaces can be improved from about 0.50 nm/min to about 0.32 nm/min.

FIGS. 6A and 6B are scanning electron microscope (SEM) images showing cross-sectional views of SiN films formed on trench structures, prior to and after exposure to a 5 minute dip in dHF 100:1 wet etch solution, respectively. The SiN films of FIGS. 6A and 6B were formed according to the process described with reference to FIG. 5A above.

FIGS. 6C and 6D are SEM images showing cross-sectional views of SiN films formed on trench structures, prior to and after exposure to a 5 minute dip in dHF 100:1 wet etch solution, respectively, where the SiN films are formed according to the process described with reference to FIG. 5C above.

As shown in FIGS. 6A and 6C, the SiN film formed using the higher pressure PEALD process demonstrated improved conformality (e.g., a conformality value of about 92%) prior to the wet etch dip, as compared to the SiN film formed using the lower pressure PEALD process (e.g., a conformality value of about 69%). As shown in FIGS. 6B and 6D, the conformality of the SiN thin film formed using the higher pressure PEALD process was maintained subsequent to the wet etch dip, while that of the SiN thin film formed using the lower pressure PEALD process was significantly decreased. Additionally, the SiN thin film formed using the higher pressure PEALD process demonstrated a wet etch rate ratio (WERR) of about 1, while the SiN thin film formed using the lower pressure PEALD process demonstrated a WERR of about 1.55 to about 0.26 (top surfaces to sidewall surfaces).

Specific Contexts for Use of SiN Films

The methods and materials described herein can provide films with increased quality and improved etch properties not only for traditional lateral transistor designs, with horizontal source/drain (S/D) and gate surfaces, but can also provide improved SiN films for use on non-horizontal (e.g., vertical) surfaces, and on complex three-dimensional (3D) structures. In certain embodiments, SiN films are deposited by the disclosed methods on a three-dimensional structure during integrated circuit fabrication. The three-dimensional transistor may include, for example, double-gate field effect transistors (DG FET), and other types of multiple gate FETs, including FinFETs. For example, the silicon nitride thin films of the present disclosure may be useful in nonplanar multiple gate transistors, such as FinFETs, where it may be desirable to form silicide on vertical walls, in addition to the tops of the gate, source, and drain regions.

Another 3D structure for which the SiN deposition techniques taught herein are particularly useful is a 3D elevated source/drain structure, as taught in U.S. Patent Publication No. 2009/0315120 by Shifren et al., the disclosure of which is incorporated herein by reference in its entirety. Shifren et al. teach elevated source/drain structures that include vertical sidewalls.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of forming a silicon nitride thin film on a substrate in a reaction space comprising:
   a plurality of super-cycles comprising:
      a plurality of silicon nitride deposition sub-cycles comprising alternately and sequentially contacting the substrate with a silicon precursor and a nitrogen plasma at a pressure of 5 Torr or less; and
      a plurality of high-pressure treatment sub-cycles, wherein at least one of the plurality of high-pressure treatment sub-cycles comprises contacting the substrate with a nitrogen plasma at a pressure of greater than 20 Torr,
   wherein the silicon nitride thin film is deposited on a three-dimensional structure on the substrate and a wet etch rate ratio of a wet etch rate of silicon nitride formed on a sidewall surface of the three-dimensional structure to a wet etch rate of the silicon nitride formed on a top surface of the three-dimensional structure is from about 0.8 to about 1.33 in dilute HF.

2. The method of claim 1, wherein the silicon precursor is $H_2SiI_2$.

3. The method of claim 1, wherein the nitrogen-containing plasma is generated from a nitrogen precursor selected from the group consisting of $NH_3$, $N_2H_4$, an $N_2/H_2$ mixture, $N_2$, and any mixtures thereof.

4. The method of claim of claim 1, wherein a wet etch rate ratio of a wet etch rate of silicon nitride formed on a sidewall surface of the three-dimensional structure to a wet etch rate of the silicon nitride formed on a top surface of the three-dimensional structure is 1:1 in dilute HF.

5. The method of claim 1, wherein the at least one silicon nitride deposition sub-cycle further comprises flowing a carrier gas throughout the at least one silicon nitride deposition sub-cycle.

6. The method of claim 1, wherein the at least one silicon nitride deposition sub-cycle further comprises flowing a hydrogen-containing gas and a nitrogen-containing gas throughout the at least one silicon nitride deposition sub-cycle.

7. The method of claim 6, wherein the hydrogen-containing gas and the nitrogen-containing gas are used to form the nitrogen-containing plasma.

8. The method of claim 1, wherein the at least one high-pressure treatment sub-cycle further comprises flowing a carrier gas throughout the at least one high-pressure treatment sub-cycle.

9. The method of claim 1, wherein the pressure in the high pressure treatment sub-cycles is 20 Torr to 500 Torr.

10. The method of claim 1, wherein the pressure in the high pressure treatment sub-cycles is 20 Torr to 30 Torr.

* * * * *

UNITED STATES PATENT AND TRADEMARK OFFICE
CERTIFICATE OF CORRECTION

PATENT NO. : 10,410,857 B2
APPLICATION NO. : 14/834290
DATED : September 10, 2019
INVENTOR(S) : Toshiya Suzuki et al.

Page 1 of 1

It is certified that error appears in the above-identified patent and that said Letters Patent is hereby corrected as shown below:

In the Specification

In Column 1, Line 39, delete "BF" and insert --HF--.

In Column 1, Line 67, delete "BF" and insert --HF--.

In Column 2, Line 52, after "about 1:1." delete "In some embodiments,".

In Column 4, Line 33, delete "BF" and insert --HF--.

In Column 25, Line 19, delete "RF-dip" and insert --HF-dip--.

In the Claims

In Column 28, Line 10 (Approx.), Claim 4, delete "of claim of claim" and insert --of claim--.

Signed and Sealed this
Twenty-fourth Day of December, 2019

Andrei Iancu
*Director of the United States Patent and Trademark Office*